US011164643B2

(12) United States Patent
Kim et al.

(10) Patent No.: US 11,164,643 B2
(45) Date of Patent: *Nov. 2, 2021

(54) NON-VOLATILE MEMORY DEVICE AND PROGRAMMING METHOD THEREOF

(71) Applicant: Samsung Electronics Co., Ltd., Suwon-si (KR)

(72) Inventors: Byungsoo Kim, Yongin-si (KR); Wandong Kim, Incheon (KR); Jaeyong Jeong, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/686,567

(22) Filed: Nov. 18, 2019

(65) Prior Publication Data
US 2020/0350029 A1 Nov. 5, 2020

(30) Foreign Application Priority Data
Apr. 30, 2019 (KR) ........................ 10-2019-0050453

(51) Int. Cl.
*G11C 16/34* (2006.01)
*G11C 16/04* (2006.01)
*G11C 16/10* (2006.01)
*G11C 16/08* (2006.01)
*G11C 11/56* (2006.01)
*G11C 16/26* (2006.01)

(52) U.S. Cl.
CPC ...... *G11C 16/3459* (2013.01); *G11C 11/5628* (2013.01); *G11C 11/5671* (2013.01); *G11C 16/0483* (2013.01); *G11C 16/08* (2013.01); *G11C 16/10* (2013.01); *G11C 16/26* (2013.01); *G11C 2211/5621* (2013.01); *G11C 2216/14* (2013.01)

(58) Field of Classification Search
CPC .................................................. G11C 16/3459
See application file for complete search history.

(56) References Cited

U.S. PATENT DOCUMENTS

| 8,850,103 | B2 | 9/2014 | Bennett |
| 8,897,085 | B2 | 11/2014 | Li |
| 9,293,206 | B2 | 3/2016 | Nam |
| 9,659,636 | B2 | 5/2017 | Lee |
| 9,837,163 | B2 | 12/2017 | Kim et al. |
| 2018/0151237 | A1* | 5/2018 | Lee ..................... G11C 16/3459 |

(Continued)

FOREIGN PATENT DOCUMENTS

| JP | 4986213 B2 | 2/2008 |
| KR | 10-1881595 B1 | 7/2018 |

*Primary Examiner* — Douglas King
(74) *Attorney, Agent, or Firm* — Myers Bigel, P.A.

(57) ABSTRACT

A non-volatile memory device includes a memory cell array including memory cells respectively connected to bit lines; and a control logic unit configured to control a program operation with respect to the memory cells. The control logic unit is configured to perform a normal program verify operation with respect to the memory cells by using a normal program verify condition, during the program operation, and, based on a suspend command that is received during the program operation, perform an initial program verify operation with respect to the memory cells by using an initial program verify condition that is different from the normal program verify condition.

20 Claims, 26 Drawing Sheets

(56) References Cited

U.S. PATENT DOCUMENTS

2018/0197610 A1 7/2018 Lee
2018/0247695 A1* 8/2018 Kasai .................... G11C 16/10
2020/0227398 A1 7/2020 Oh et al.

* cited by examiner

NON-VOLATILE MEMORY DEVICE AND PROGRAMMING METHOD THEREOF

CROSS-REFERENCE TO RELATED APPLICATION

This application claims the benefit of Korean Patent Application No. 10-2019-0050453, filed on Apr. 30, 2019, in the Korean Intellectual Property Office, the disclosure of which is incorporated by reference herein in its entirety.

FIELD

The inventive concepts relate to memory devices, and more particularly, to non-volatile memory devices in which a suspend-resume operation is performed during a program operation, and programming methods for the non-volatile memory devices.

BACKGROUND

Memory devices are used to store data, and are classified as volatile memory devices or non-volatile memory devices. When execution of a read operation is required during a program operation of non-volatile memory devices, a memory controller may suspend the program operation that is currently being executed, perform the read operation, and may then resume the suspended program operation. A time interval between the suspending and the resuming may cause degradation of a program threshold voltage distribution and/or reliability of the memory device.

SUMMARY

The inventive concepts provide a non-volatile memory device capable of preventing degradation of a program threshold voltage distribution during a program suspend-resume operation, and a method of programming of the non-volatile memory device.

According to an aspect of the inventive concepts, there is provided a non-volatile memory device including a memory cell array including memory cells respectively connected to bit lines; and a control logic unit configured to control a program operation with respect to the memory cells. The control logic unit is configured to perform a normal program verify operation with respect to the memory cells by using a normal program verify condition, during the program operation, and, based on a suspend command that is received during the program operation, perform an initial program verify operation with respect to the memory cells by using an initial program verify condition that is different from the normal program verify condition.

According to another aspect of the inventive concepts, there is provided a method of programming of a non-volatile memory device, the method including applying a first program voltage to a selected word line to which memory cells are connected, in response to a program command; performing an initial program verify operation by developing, during an initial develop time, voltage levels of sensing nodes respectively connected to bit lines respectively connected to the memory cells, in response to a suspend command or a resume command received after the suspend command; applying a second program voltage to the selected word line in response to the resume command; and performing a normal program verify operation by developing the voltage levels of the sensing nodes during a normal develop time that is different from the initial develop time.

According to another aspect of the inventive concepts, there is provided a method of programming of a non-volatile memory device, the method including applying a first program voltage to a selected word line to which memory cells are connected, in response to a program command; performing an initial program verify operation by applying an initial program verify voltage to the selected word line, in response to a suspend command or a resume command received after the suspend command; applying a second program voltage to the selected word line in response to the resume command; and performing a normal program verify operation by applying, to the selected word line, a normal program verify voltage that is different from the initial program verify voltage.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EMBODIMENTS

Embodiments will now be described more fully with reference to the accompanying drawings.

Figure 1:
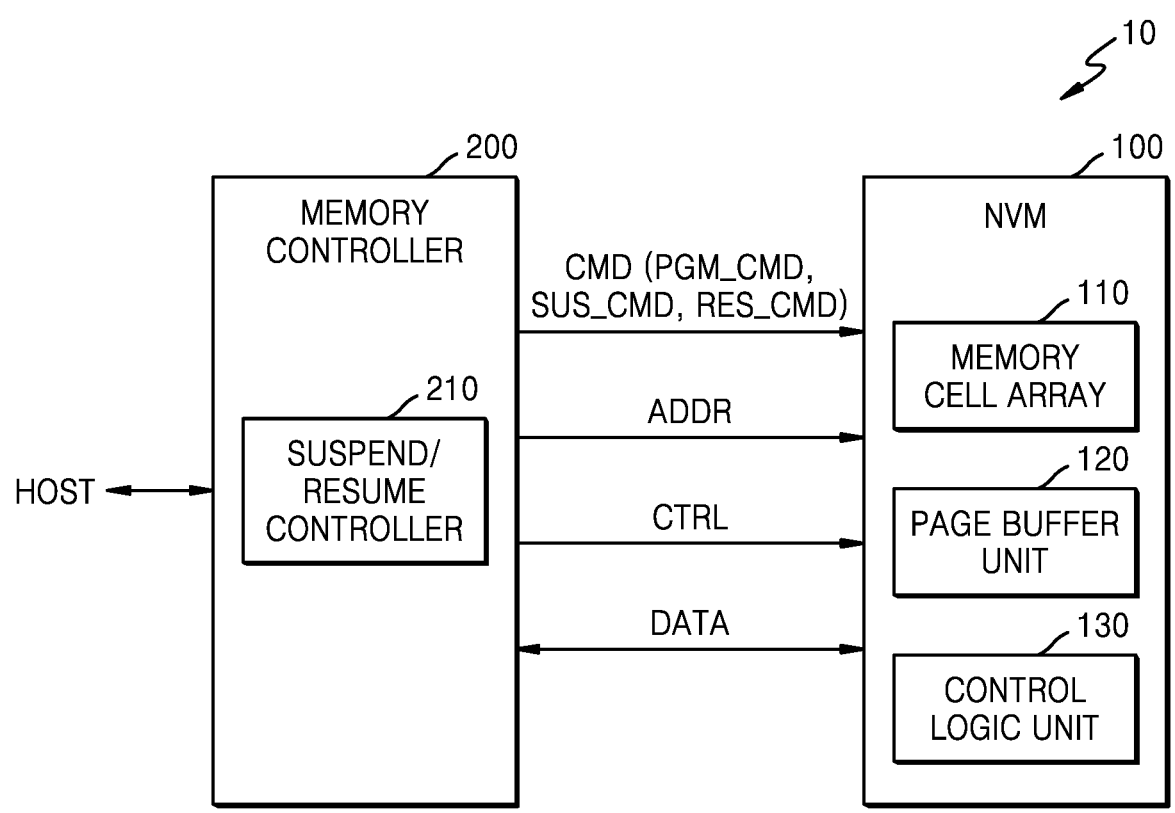
FIG. 1 is a block diagram of a memory system according to some embodiments of the inventive concepts.

FIG. 1 is a block diagram of a memory system 10 according to some embodiments of the inventive concepts.

Referring to FIG. 1, the memory system 10 may include a non-volatile memory device (NVM) 100 and a memory controller 200. The NVM 100 may include a memory cell array 110, a page buffer unit 120, and a control logic unit 130. The memory cell array 110 may include a plurality of memory cells, and the page buffer unit 120 may include a plurality of page buffers.

In response to a write/read request from a host HOST, the memory controller 200 may control the NVM 100 such that data is read from the NVM 100 or programmed to the NVM 100. In detail, the memory controller 200 may control program, read, and erase operations with respect to the NVM 100, by providing a command CMD, an address ADDR, and a control signal CTRL to the NVM 100. Data DATA to be programmed and read data DATA may be transmitted or received between the memory controller 200 and the NVM 100.

The memory controller 200 may generate a suspend command SUS_CMD and a resume command RES_CMD and may transmit the suspend command SUS_CMD and the resume command RES_CMD to the NVM 100. For example, while the NVM 100 is performing a program operation, the memory controller 200 may receive a read request from the host HOST. At this time, the memory controller 200 may transmit the suspend command SUS_CMD to the NVM 100 and may control a read operation with respect to the NVM 100. When the read operation is completed, the memory controller 200 may transmit the resume command RES_CMD to the NVM 100. A suspend-resume operation during a program operation of the NVM 100 will now be primarily described by way of example. However, the inventive concepts are not limited thereto. For example, embodiments of the inventive concepts are likewise applicable to the suspend-resume operation during an erase operation of the NVM 100.

In detail, the memory controller 200 may include a suspend/resume controller 210, and the suspend/resume controller 210 may control a suspend operation and a resume operation with respect to the NVM 100. According to some embodiments, the suspend/resume controller 210 may be implemented as software or firmware, and a processor included in the memory controller 200 may execute instructions for performing a function of the suspend/resume controller 210. According to some embodiments, the suspend/resume controller 210 may be implemented as hardware.

The control logic unit 130 may receive a program command PGM_CMD from the memory controller 200 and may control a program operation with respect to the memory cells included in the memory cell array 110 in response to the received program command PGM_CMD. At this time, the control logic unit 130 may sequentially perform a plurality of program loops during a program operation, and each of the plurality of program loops may include a normal program verify operation to which a normal program verify condition is applied. For example, the normal program verify condition may include a normal develop time and a normal program verify voltage.

The control logic unit 130 may receive the suspend command SUS_CMD from the memory controller 200 during the program operation and perform an initial program verify operation in response to the suspend command SUS_CMD. The control logic unit 130 may receive the resume command RES_CMD from the memory controller 200 after the suspend command SUS_CMD and perform an initial program verify operation in response to the resume command RES_CMD. The initial program verify operation is a program verify operation to which an initial program verify condition different from the normal program verify condition is applied, and may be referred to as a "suspend program verify operation" or a "resume program verify operation". For example, the initial program verify condition may include an initial develop time that is different from the normal develop time, and an initial program verify voltage that is different from the normal program verify voltage.

Figure 2:
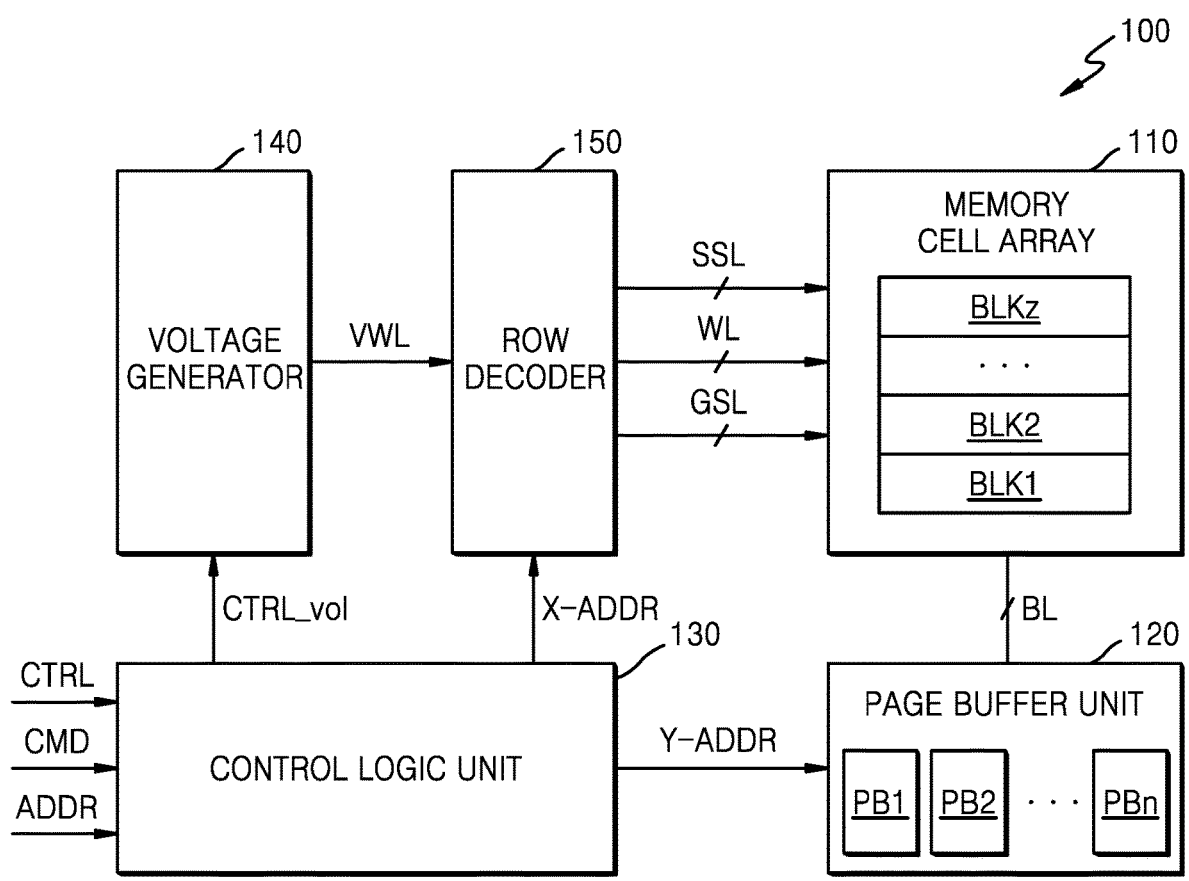
FIG. 2 is a block diagram of a non-volatile memory device (NVM) of FIG. 1, according to some embodiments of the inventive concepts.

FIG. 2 is a block diagram illustrating the NVM 100 of FIG. 1 in greater detail, according to some embodiments of the inventive concepts.

Referring to FIG. 2, the NVM 100 may include the memory cell array 110, the page buffer unit 120, the control logic unit 130, a voltage generator 140, and a row decoder 150. The NVM 100 may further include a data input/output (I/O) circuit or an I/O interface. The NVM 100 may further include a column logic unit, a voltage generator, a pre-decoder, a temperature sensor, a command decoder, an address decoder, and the like.

The memory cell array 110 may be connected to the page buffer unit 120 via bit lines BL and may be connected to the row decoder 150 via word lines WL, string select lines SSL, and ground select lines GSL. The memory cell array 110 may be include a plurality of memory blocks BLK1 through BLKz (where z is a positive integer), and each of the plurality of memory blocks BLK1 through BLKz may include a plurality of memory cells. For example, the plurality of memory cells may be flash memory cells. Embodiments of the inventive concepts will now be described in detail with reference to a case where the plurality of memory cells are NAND flash memory cells. However, the inventive concepts are not limited thereto. For example, in some embodiments, the plurality of memory cells may be resistive memory cells, such as resistive random access memory (ReRAM), phase change RAM (PRAM), or magnetic RAM (MRAM).

According to some embodiments, the memory cell array 110 may include a three-dimensional (3D) memory cell array, the 3D memory cell array may include a plurality of NAND strings, and each of the plurality of NAND strings may include memory cells respectively connected to word lines vertically stacked on a substrate. This will be described with reference to FIG. 3. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133, 8,553,466, 8,654,587, 8,559,235, and US 2011/0233648. According to some embodiments, the memory cell array 110 may include a two-dimensional (2D) memory cell array, and the 2D memory cell array may include a plurality of NAND strings arranged in a column direction and a row direction.

The page buffer unit 120 may include a plurality of page buffers PB1 through PBn (where n is an integer greater than or equal to 2), and the plurality of page buffers PB1 through PBn may be connected to the memory cells via the plurality of bit lines BL, respectively. The page buffer unit 120 may select some of the plurality of bit lines BL in response to a column address Y-ADDR. In detail, the page buffer unit 120 operates as a write driver or a sense amplifier according to operation modes.

Based on the command CMD, the address ADDR, and the control signal CTRL, the control logic unit 130 may output various controls signals for programming data to the memory cell array 110, reading data from the memory cell array 110, or erasing data from the memory cell array 110, for example, a voltage control signal CTRL_vol, a row address X-ADDR, and the column address Y-ADDR. Accordingly, the control logic unit 130 may control various operations of the NVM 100.

The control logic unit 130 may control a normal program verify operation and an initial program verify operation differently. The normal program verify operation may be performed in a program loop before the suspend command SUS_CMD or when the suspend command SUS_CMD is not received, or in a program loop after an initial program verify operation is performed. The initial program verify operation may be performed in response to the suspend command SUS_CMD or in response to the resume command RES_CMD received after the suspend command SUS_CMD.

The control logic unit 130 may selectively perform an initial program verify operation using an initial develop time and a normal program verify operation using a normal develop time according to a program loop, a program state, or the like. For example, when a current program loop at the moment when the suspend command SUS_CMD is received is less than N, the control logic unit 130 may perform a normal program verify operation other than an initial program verify operation in response to the suspend command SUS_CMD or the resume command RES_CMD. The control logic unit 130 may change an offset between an initial program verify condition and a normal program verify condition (such as a develop time and/or a program verify voltage) according to a program loop, a program state, or the like. The term "and/or" may be used herein to include any and all combinations of one or more of the associated listed items.

The initial program verify operation may include first through M-th initial program verify operations for detecting whether programming of first through M-th program states has been completed, where M is a natural number that is greater than or equal to 2. According to some embodiments, the control logic unit 130 may independently control initial program verify conditions for the first through M-th initial program verify operations. For example, the control logic unit 130 may apply a normal develop time during the first and second initial program verify operations, apply an initial develop time that is longer than the normal develop time during the third and fourth initial program verify operations, and apply an initial develop time that is shorter than the normal develop time during the fifth and sixth initial program verify operations.

According to some embodiments, the control logic unit 130 may independently control a forcing develop time and a main develop time. For example, the control logic unit 130 may determine the forcing develop time to be equal to a normal forcing develop time and may determine the main develop time to be different from a normal main develop time. For example, the control logic unit 130 may determine the forcing develop time to be longer than the normal forcing develop time and may determine the main develop time to be shorter than the normal main develop time.

According to some embodiments, the control logic unit 130 may differently control a normal develop time that is applied to the normal program verify operation, and an initial develop time that is applied to the initial program verify operation. The control logic unit 130 may increase or decrease the initial develop time compared with the normal develop time, according to the program loop, the program state, or the like. The control logic unit 130 may change an offset of the initial develop time with respect to the normal develop time, according to the program loop, the program state, or the like.

According to some embodiments, the control logic unit 130 may differently control a normal program verify voltage that is applied to the normal program verify operation, and an initial program verify voltage that is applied to the initial program verify operation. The control logic unit 130 may increase or decrease the initial program verify voltage compared with the normal program verify voltage, according to the program loop, the program state, or the like. The control logic unit 130 may change an offset of the initial program verify voltage with respect to the normal program verify voltage, according to the program loop, the program state, or the like.

The voltage generator 140 may generate various types of voltages for performing program, read, and erase operations with respect to the memory cell array 110, based on the voltage control signal CTRL_vol. In detail, the voltage generator 140 may generate word line voltages VWL, for example, a program voltage, a read voltage, and a program verify voltage. The program verify voltage may include a normal program verify voltage and an initial program verify voltage.

In response to the row address X-ADDR, the row decoder 150 may select one memory block from the plurality of memory blocks BLK1 through BLKz, select one word line from the word lines WL of the selected memory block, and select one string select line from among a plurality of string select lines SSL. The row decoder 150 may apply the normal program verify voltage to the selected word line during the normal program verify operation and apply the initial program verify voltage to the selected word line during the initial program verify operation.

Figure 3:
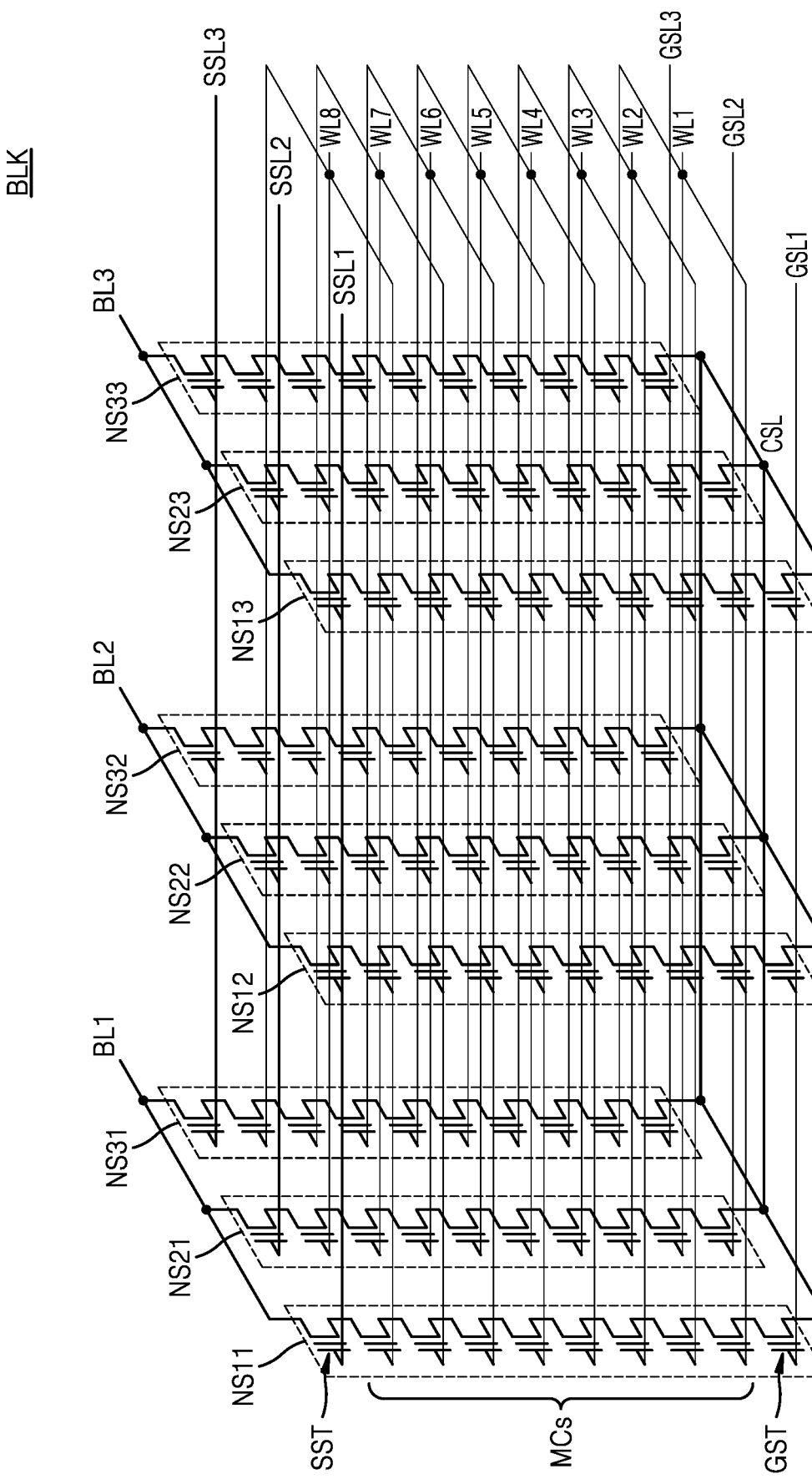
FIG. 3 is a circuit diagram of a memory block according to some embodiments of the inventive concepts.

FIG. 3 is a circuit diagram of a memory block BLK according to some embodiments of the inventive concepts.

Referring to FIG. 3, the memory block BLK may include NAND strings NS11 through NS13, NS21 through NS23, and NS31 through NS33, word lines WL1 through WL8, first through third bit lines BL1 through BL3, ground select lines GSL1 through GSL3, string select lines SSL1 through SSL3, and a common source line CSL. The memory block BLK may correspond to one of the memory blocks BLK1 through BLKz of FIG. 2. The number of NAND strings, the number of word lines, the number of bit lines, the number of ground select lines, and the number of string select lines may be variously changed according to embodiments. Also, the terms first, second, etc. may be used herein to distinguish one element from another element, but these elements should not be limited by these terms.

The NAND strings NS11, NS21, and NS31 are provided between the first bit line BL1 and the common source line CSL, the NAND strings NS12, NS22, and NS32 are provided between the second bit line BL2 and the common source line CSL, and the NAND strings NS13, NS23, and NS33 are provided between the third bit line BL3 and the common source line CSL. Each NAND string (for example, the NAND string NS11) may include a string select transistor SST, a plurality of memory cells MCs, and a ground select transistor GST that are connected in series.

The string select transistor SST is connected to a corresponding one of the string select lines SSL1 through SSL3. The memory cells MCs are connected to the word lines WL1 through WL8, respectively. The ground select transistor GST is connected to a corresponding one of the ground select lines GSL1 through GSL3. The string select transistor SST is connected to a corresponding one of the first through bit lines BL1 through BL3, and the ground selection transistor GST is connected to the common source line CSL.

Figure 4:
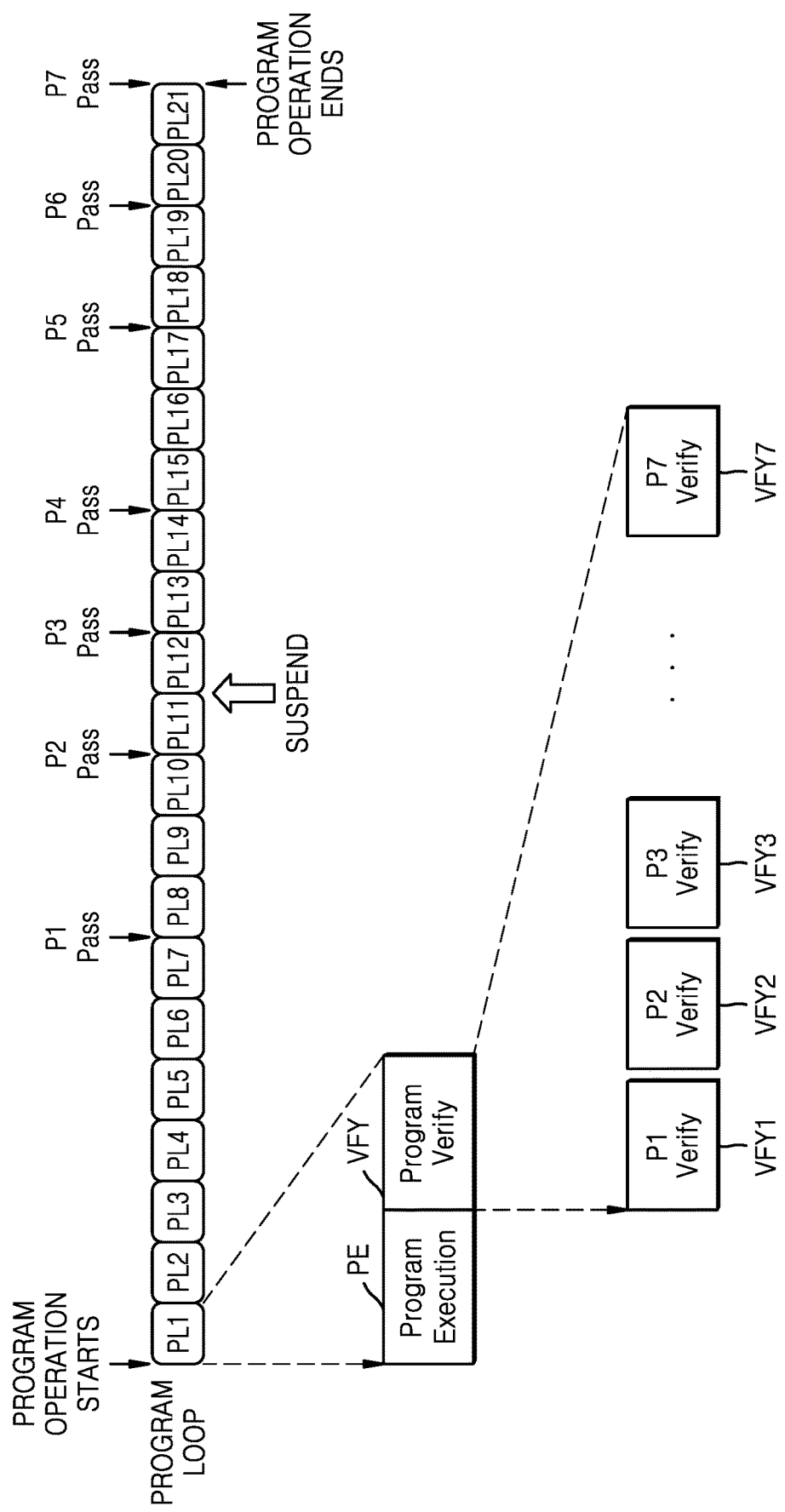
FIG. 4 illustrates a program operation including a plurality of program loops, according to some embodiments of the inventive concepts.

FIG. 4 illustrates a program operation including a plurality of program loops according to some embodiments of the inventive concepts.

Referring to FIGS. 1 and 4, the program operation may include a plurality of program loops (for example, first through twenty first program loops PL1 through PL21), and each of the plurality of program loops may include a program execution operation PE and a program verify operation VFY. For example, when memory cells are triple level cells (TLCs) each capable of storing 3-bit data, the memory cells may be programmed to one of first through seventh program states P1 through P7. The program verify operation VFY may include one or more of first through seventh program verify operations VFY1 through VFY7, the first program verify operation VFY1 corresponding to the first program state P1 and the seventh program verify operation VFY7 corresponding to the seventh program state P7.

As a plurality of program loops are conducted, memory cells are gradually program-passed. Being program-passed refers to memory cells entering a target threshold voltage region. For example, memory cells targeted for the first program state P1 having a lowest target threshold voltage may be all program-passed in the seventh program loop PL7. After the seventh program state P7 having a highest target threshold voltage region is program-passed, the program operation is finally concluded.

During the program operation, when the NVM 100 receives the suspend command SUS_CMD from the memory controller 200, the program operation may be suspended. Although the program operation is suspended in the eleventh program loop PL11 in FIG. 4, this is merely an example, and the program operation may be suspended in any of the first through twenty first program loops PL1 through PL21.

Figure 5:
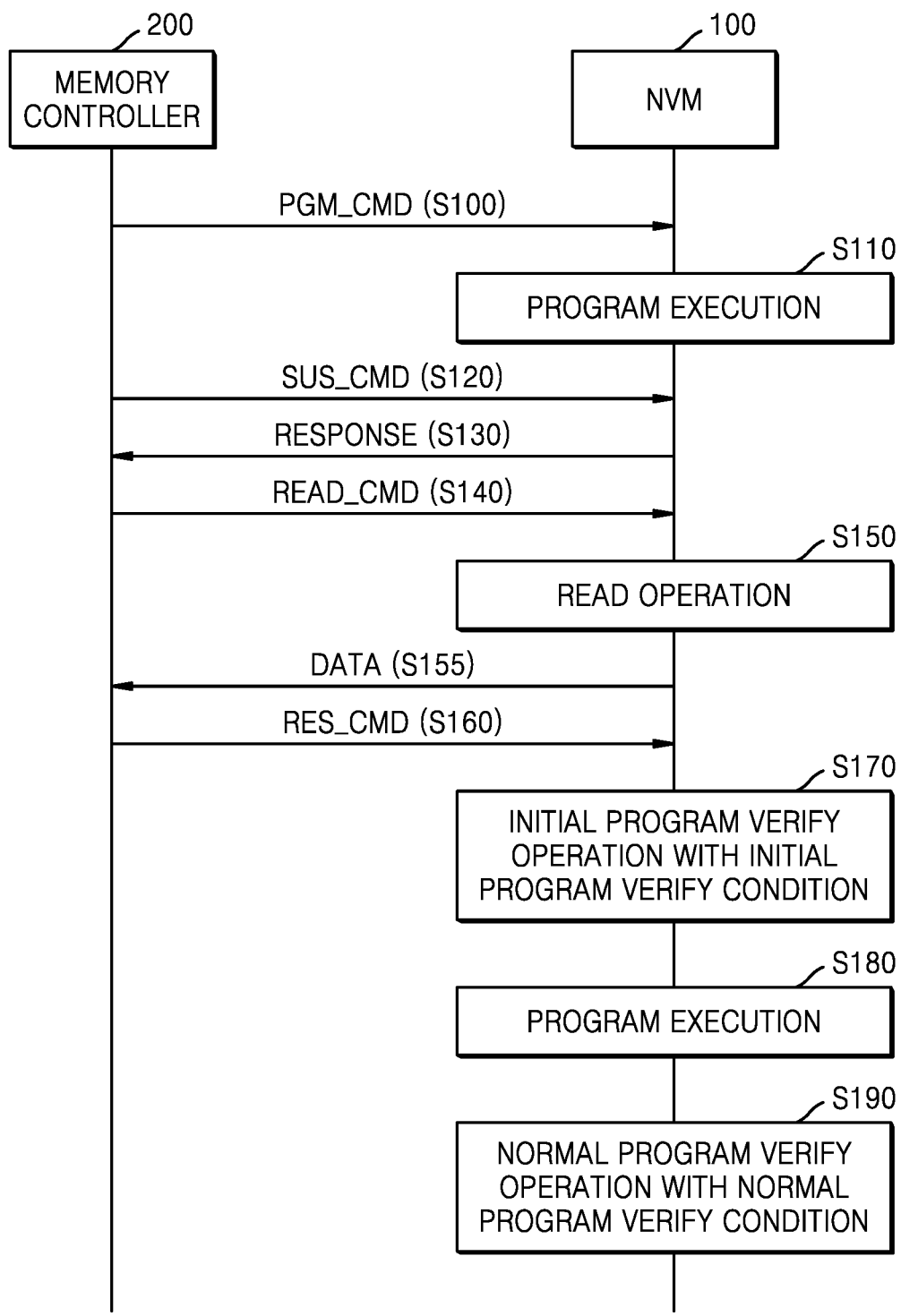
FIG. 5 is a flowchart of an operation between a memory controller and an NVM, according to some embodiments of the inventive concepts.
Figure 6:
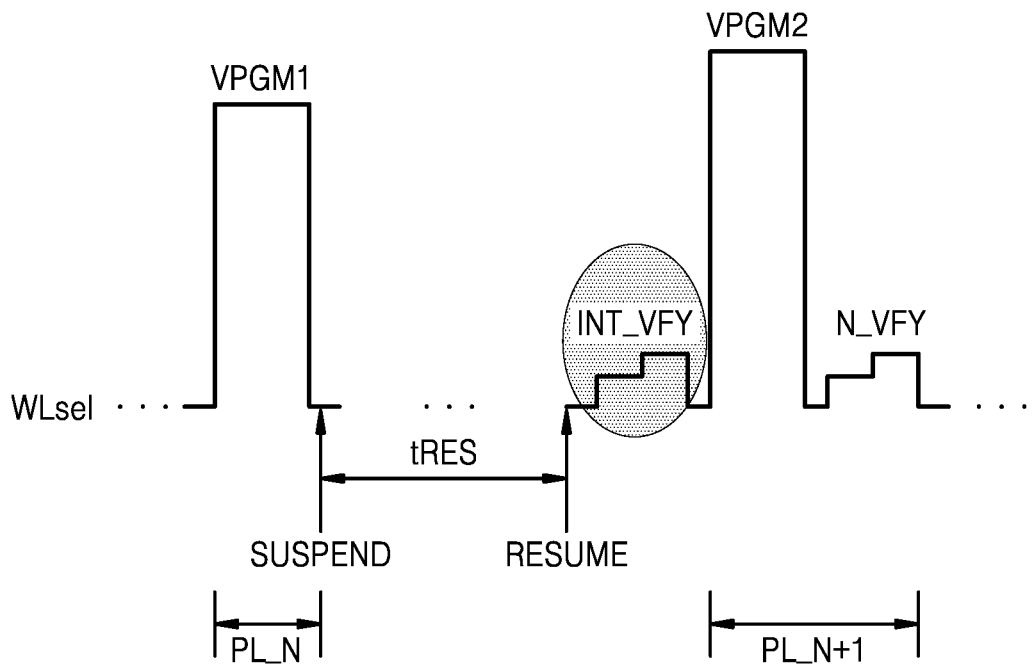
FIG. 6 illustrates a suspend-resume operation during a program operation according to some embodiments of the inventive concepts.

FIG. 5 is a flowchart of an operation between the memory controller 200 and the NVM 100, according to some embodiments of the inventive concepts. FIG. 6 illustrates a suspend-resume operation during a program operation according to some embodiments of the inventive concepts.

Referring to FIGS. 5 and 6, in operation S100, the memory controller 200 transmits the program command PGM_CMD to the NVM 100. In operation S110, the NVM 100 performs a program execution operation in response to the program command PGM_CMD. For example, operation S110 may correspond to an N-th program loop PL_N. In a program execution section of the N-th program loop PL_N, a first program voltage VPGM1 may be applied to a selected word line WLsel. Here, N may be a natural number.

In operation S120, the memory controller 200 transmits the suspend command SUS_CMD to the NVM 100. Accordingly, a program operation of the NVM 100 may be suspended. According to some embodiments, when the suspend command SUS_CMD is received during program execution of the N-th program loop PL_N, the NVM 100 may complete the currently-being-performed program execution operation and then may enter suspending. In operation S130, the NVM 100 transmits, to the memory controller 200, a response message indicating that the program operation has been suspended.

In operation S140, the memory controller 200 transmits a read command READ_CMD to the NVM 100. In operation S150, the NVM 100 performs a read operation. In operation S155, the NVM 100 transmits read-out data to the memory controller 200. However, the inventive concepts are not limited thereto, and the memory controller 200 may transmit another command or commands between the suspend command SUS_CMD and the resume command RES_CMD, and thus, the NVM 100 may perform an operation corresponding to the received command.

In operation S160, the memory controller 200 transmits the resume command RES_CMD to the NVM 100. As the NVM 100 receives the resume command RES_CMD, the program operation may be resumed. A time between a suspend time point and a resume time point may be referred to as "a suspend-resume time tRES". According to some embodiments, the suspend-resume time tRES may correspond to a time interval from a time point when the suspend command SUS_CMD is received to a time point when the resume command RES_CMD is received. According to some embodiments, the suspend-resume time tRES may correspond to a time interval from a time point when the program operation has been actually suspended to a time point when the program operation has been actually resumed.

Figure 7A:
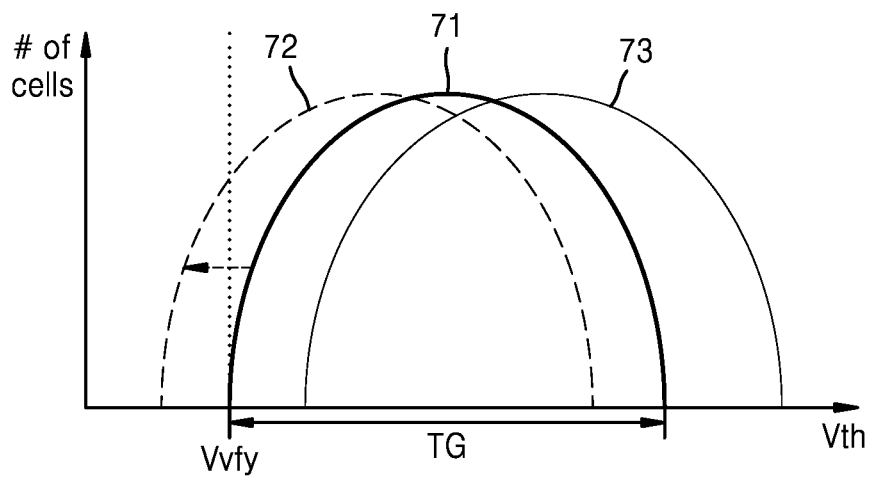
FIGS. 7A and 7B are graphs showing degradation of a threshold voltage distribution that is generated due to a suspend-resume operation according to some embodiments of the inventive concepts.
Figure 7B:
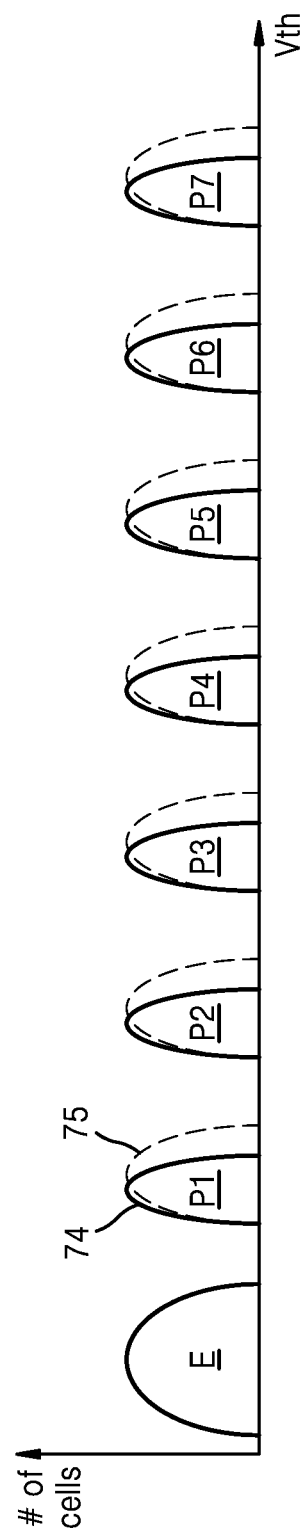

FIGS. 7A and 7B are graphs showing degradation of a threshold voltage distribution that is generated due to a suspend-resume operation according to some embodiments of the inventive concepts.

Referring to FIG. 7A, the horizontal axis indicates a threshold voltage Vth, and the vertical axis indicates the number of memory cells. A first distribution 71 may correspond to a distribution at the moment when suspending is entered and may be one of a plurality of program states (for example, the first through seventh program states P1 through P7 of FIG. 4). A second distribution 72 may correspond to a distribution after the lapse of the suspend-resume time tRES, namely, a distribution at a resume time point. A charge loss phenomenon may occur where charges escape from a charge storage layer of a memory cell, during the suspend-resume time tRES, and accordingly, a threshold voltage of the memory cell may be lowered.

When the threshold voltage of the memory cell is increased to be greater than a program verify voltage Vvfy as in the first distribution 71 by the program execution operation of the N-th program loop PL_N, and when a program verify operation is performed immediately after program execution without any suspend-resume operation, it may be determined that the memory cell is program-passed. However, when program suspending is entered according to the suspend command SUS_CMD, the threshold voltage of the memory cell may be lowered as in the second distribution 72 by the suspend-resume time tRES, and the memory cell may be determined to be program-failed by the program verify operation after program resuming. The memory cell determined to be program-failed may undergo a program execution operation in an (N+1)th program loop PL_N+1, and accordingly, as in a third distribution 73, the threshold voltage of the memory cell may be greater than that of a target region TG, and a read error to the NVM 100 may occur.

Referring to FIG. 7B, the horizontal axis indicates a threshold voltage Vth and the vertical axis indicates the number of memory cells. A first distribution 74 indicates a threshold voltage distribution of memory cells when a program operation is performed without any suspend-resume operation, and a second distribution 75 indicates a threshold voltage distribution of the memory cells when the suspend-resume operation is performed during the program operation. When the suspend-resume operation is performed during the program operation, a program threshold voltage distribution may be widened to the right as in the second distribution 75 by an over-program operation. This degradation of a program threshold voltage distribution can cause a read failure during a read operation after a program operation is concluded, thereby lowering the reliability of an NVM.

Referring back to FIGS. 5 and 6, in operation S170, the NVM 100 performs an initial program verify operation INT_VFY under an initial program verify condition. The initial program verify condition may be different from a normal program verify condition that is applied to a normal program verify operation that is performed before the suspend command SUS_CMD is received or performed in a program loop after the resume command RES_CMD is received. For example, a verify condition may include a develop time and a program verify voltage. This will be described in greater detail with reference to FIGS. 9 through 23. According to some embodiments, operation S170 may be performed between operations S120 and S130 or between operations S130 and S140. This will be described in greater detail below with reference to FIG. 8.

In operation S180, the NVM 100 performs a program execution operation. For example, operation S180 may correspond to the (N+1)th program loop PL_N+1. A second program voltage VPGM2 may be applied to the selected word line WLsel in a program execution section of the (N+1)th program loop PL_N+1, and the second program voltage VPGM2 may have a voltage level that is greater than the first program voltage VPGM1 by an Incremental Step Pulse Program (ISPP) level.

In operation S190, the NVM 100 performs a normal program verify operation under a normal program verify condition. For example, operation S190 may correspond to the (N+1)th program loop PL_N+1. A normal program verify operation N_VFY may be performed in a program verify section of the (N+1)th program loop PL_N+1. In the normal program verify operation N_VFY, a program verify operation may be performed according to the normal program verify condition. This will be described in greater detail with reference to FIGS. 9 through 23.

Figure 8:
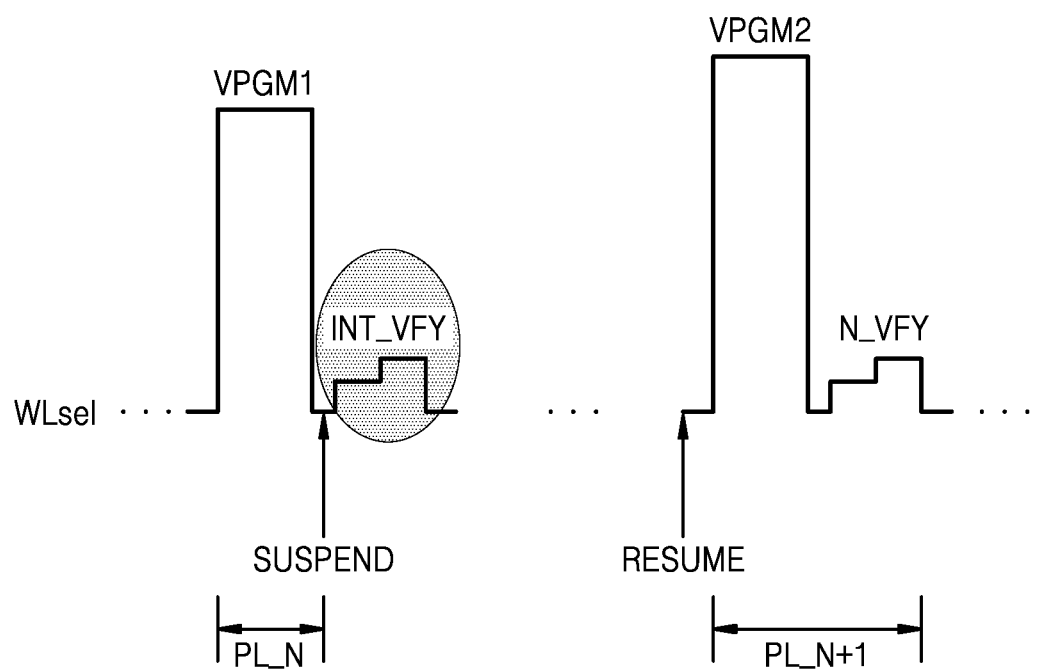
FIG. 8 illustrates a suspend-resume operation during a program operation according to some embodiments of the inventive concepts.

FIG. 8 illustrates a suspend-resume operation during a program operation according to some embodiments of the inventive concepts.

The present embodiment of FIG. 8 may correspond to a modification of the operation illustrated in FIGS. 5 and 6. According to the present embodiment, the initial program verify operation INT_VFY may be performed after the suspend command SUS_CMD is received and before the resume command RES_CMD is received. In this case, the initial program verify operation INT_VFY may be performed using the initial program verify condition that is different from the normal program verify condition. As such, in various embodiments described herein, the initial program verify operation INT_VFY may be performed after the suspend command SUS_CMD is received or after the resume command RES_CMD is received.

Figure 9:
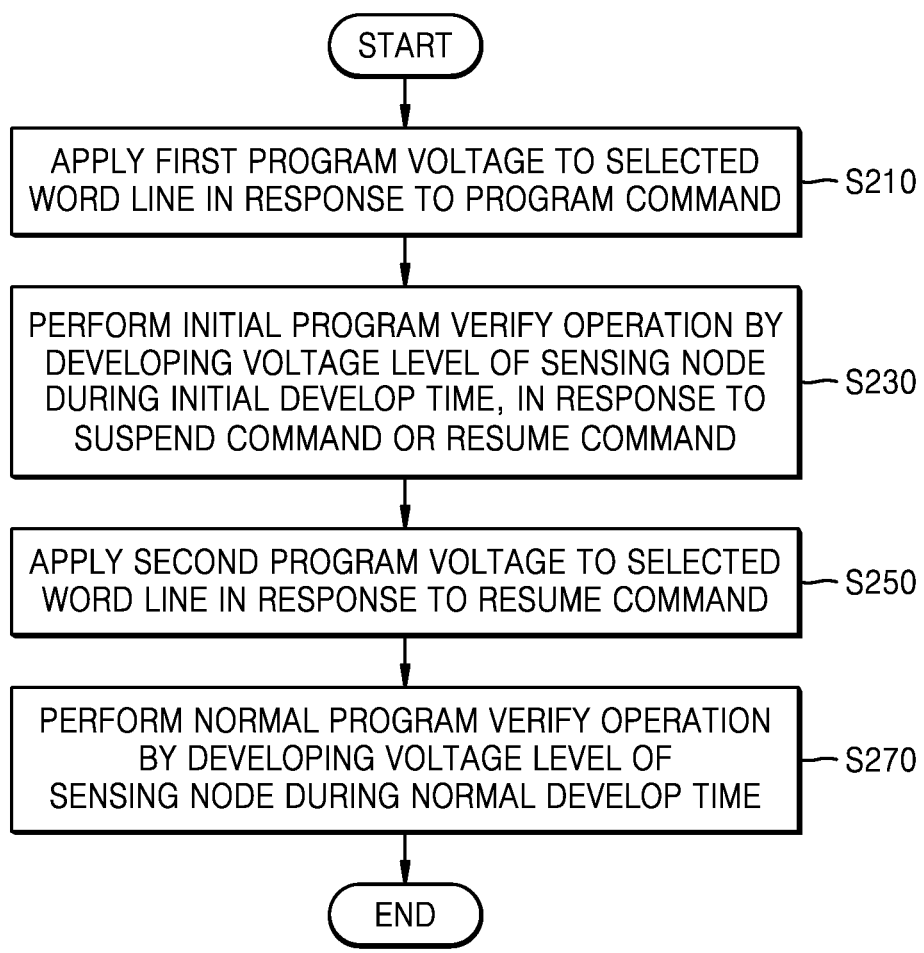
FIG. 9 is a flowchart of a method of programming an NVM, according to some embodiments of the inventive concepts.

FIG. 9 is a flowchart of a method of programming an NVM, according to some embodiments of the inventive concepts.

Referring to FIG. 9, the programming method according to the present embodiment may correspond to an operation method of the NVM when a suspend-resume operation is performed during a program operation of the NVM. For example, the programming method according to the present embodiment may be performed in the NVM 100 of FIG. 2. The descriptions given above with reference to FIGS. 1 through 8 are applicable to the present embodiment, and repeated descriptions thereof will be omitted.

In operation S210, the NVM 100 applies the first program voltage VPGM1 to the selected word line WLsel in response to the program command PGM_CMD. Operation S210 corresponds to a program execution operation. For example, operation S210 may correspond to the program execution operation in the N-th program loop PL_N of FIG. 6. In operation S230, the NVM 100 performs the initial program verify operation INT_VFY by developing the voltage level of a sensing node during an initial develop time, in response to the suspend command SUS_CMD or the resume command RES_CMD. According to some embodiments, as illustrated in FIGS. 5 and 6, operation S230 may be performed after the resume command RES_CMD is received. According to some embodiments, as illustrated in FIG. 8, operation S230 may be performed after the suspend command SUS_CMD is received but before the resume command RES_CMD is received.

In operation S250, the NVM 100 applies the second program voltage VPGM2 to the selected word line WLsel in response to the resume command RES_CMD. Operation S250 corresponds to a program execution operation. For example, operation S250 may correspond to the program execution operation in the (N+1)th program loop PL_N+1 of FIG. 6. In operation S270, the NVM 100 performs the normal program verify operation N_VFY by developing the voltage level of the sensing node during a normal develop time.

Figure 10:
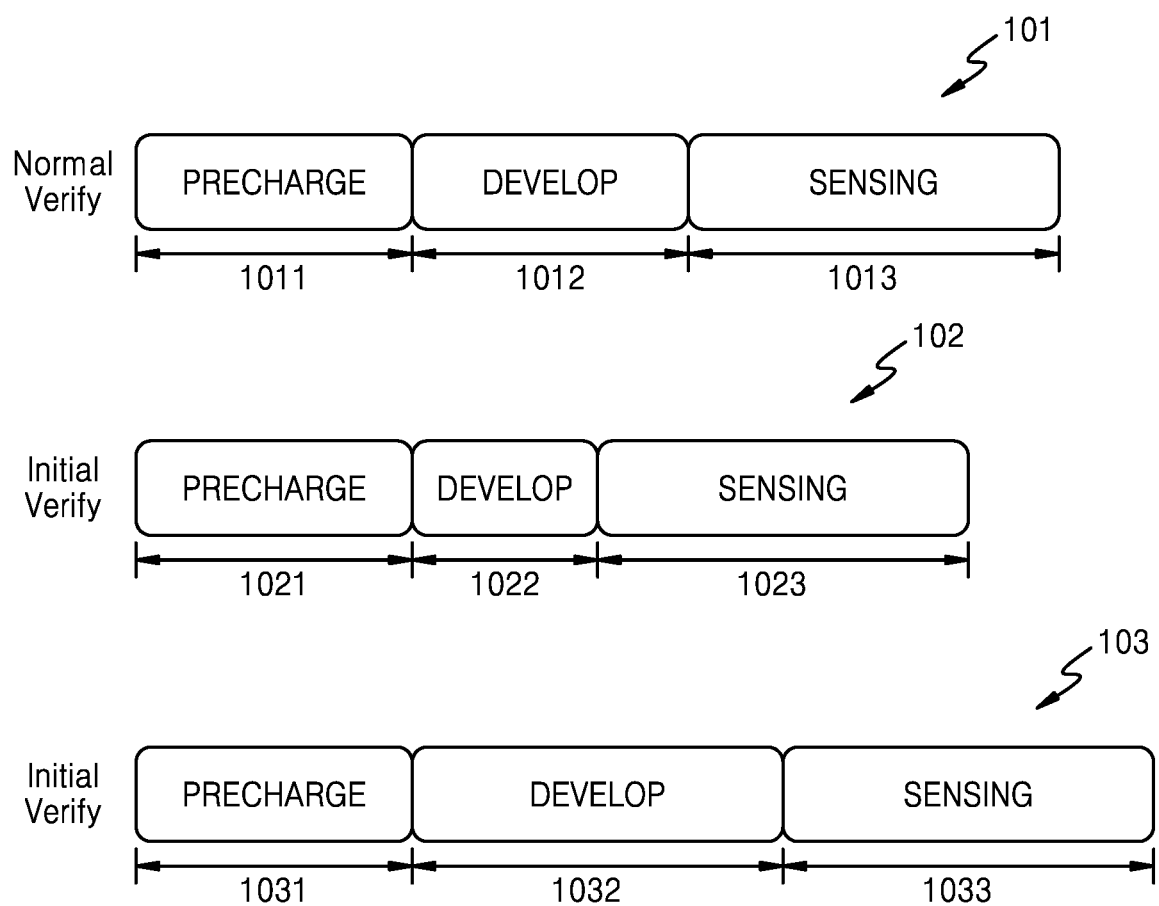
FIG. 10 illustrates a normal program verify operation and initial program verify operations according to some embodiments of the inventive concepts.

FIG. 10 illustrates a normal program verify operation 101 and initial program verify operations 102 and 103, according to some embodiments of the inventive concepts.

Referring to FIG. 10, the normal program verify operation 101 may correspond to a program verify operation that is generally performed during a program operation and may include a precharge section 1011, a develop section 1012, and a sensing section 1013. The precharge section 1011 may correspond to a section in which an operation of precharging a voltage of a bit line BL or a sensing node (for example, a sensing node SO of FIG. 11A) to a precharge voltage is performed. The develop section 1012 may correspond to a time section between the precharge section 1011 and the sensing section 1013 and may correspond to a section in which an operation of developing the voltage of the sensing node SO by electrically connecting the bit line BL to the sensing node SO is performed. The sensing section 1013 may correspond to a section in which an operation of sensing the voltage of the sensing node SO is performed.

The initial program verify operation 102 may correspond to an example of a program verify operation when a suspend-resume operation is performed during a program operation and may include a precharge section 1021, a develop section 1022, and a sensing section 1023. The precharge section 1021, the develop section 1022, and the sensing section 1023 may correspond to the precharge section 1011, the develop section 1012, and the sensing section 1013, respectively. A length of the develop section 1022 of the initial program verify operation 102 may be less than that of the develop section 1012 of the normal program verify operation 101.

The initial program verify operation 103 may correspond to another example of a program verify operation when a suspend-resume operation is performed during a program operation and may include a precharge section 1031, a develop section 1032, and a sensing section 1033. The precharge section 1031, the develop section 1032, and the sensing section 1033 may correspond to the precharge section 1011, the develop section 1012, and the sensing section 1013, respectively. A length of the develop section 1032 of the initial program verify operation 103 may be greater than that of the develop section 1012 of the normal program verify operation 101.

Figure 11A:
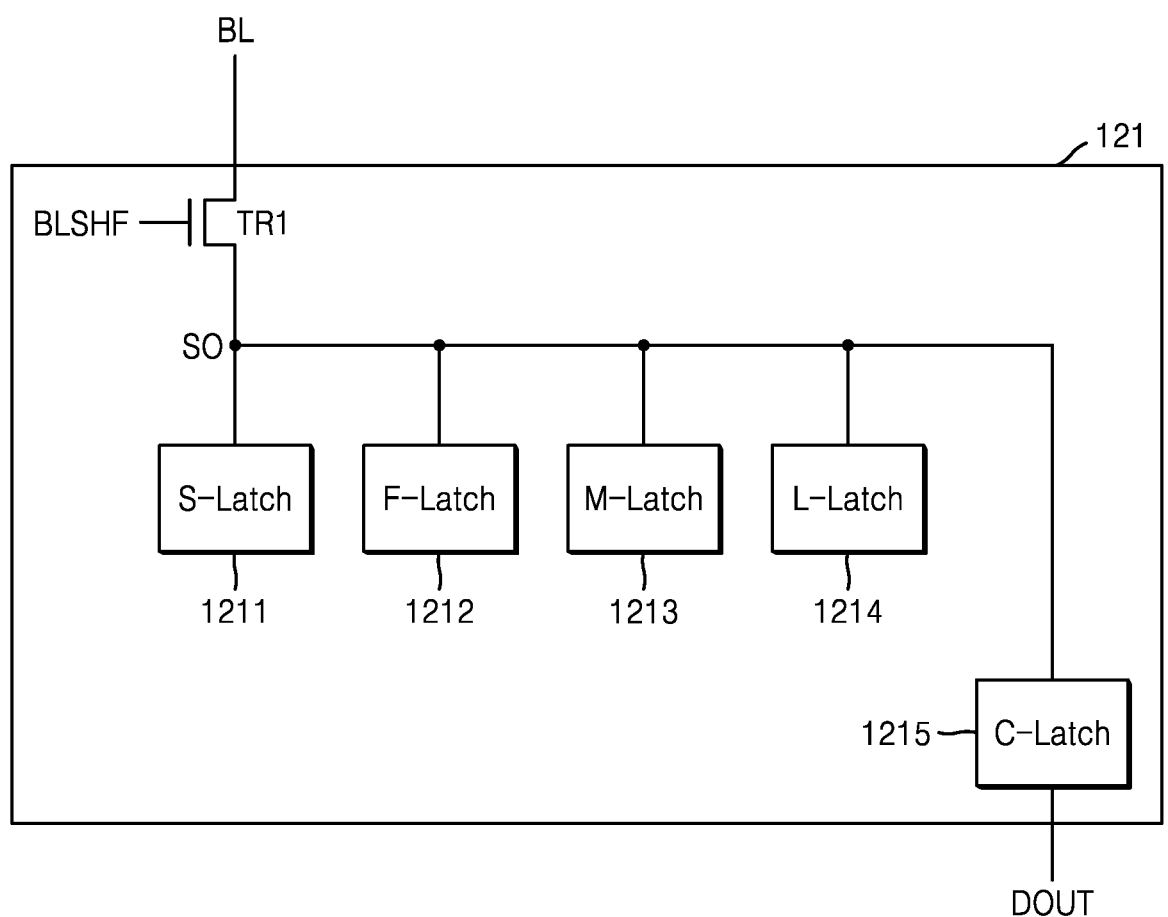
FIGS. 11A and 11B are block diagrams of page buffers according to embodiments of the inventive concepts, respectively.
Figure 11B:
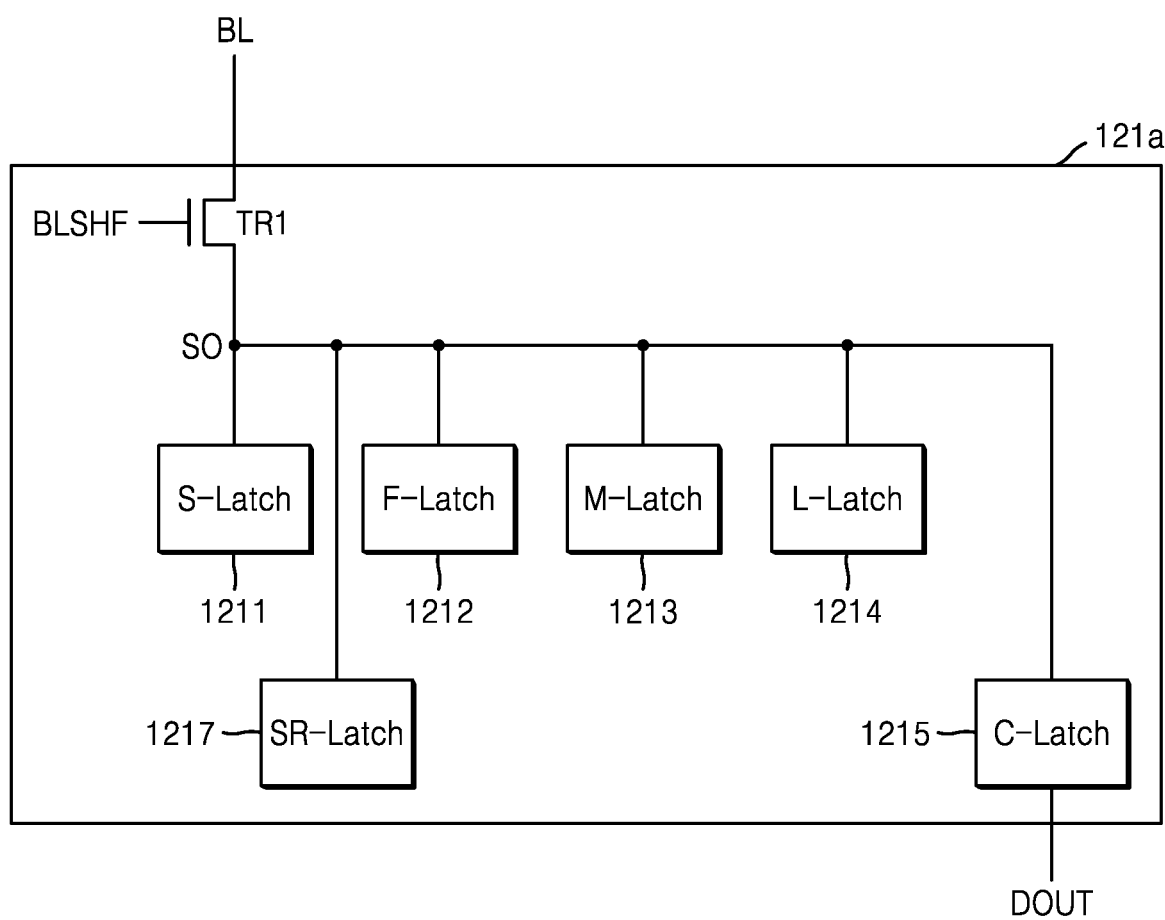

FIGS. 11A and 11B are block diagrams of page buffers according to embodiments of the inventive concepts, respectively.

Referring to FIG. 11A, a page buffer 121 may include a sense latch 1211, a force latch 1212, an upper bit latch (for example, an M-latch) 1213, a lower bit latch (for example, an L-latch) 1214, and a cache latch 1215 that are connected to the sensing node SO. The page buffer 121 may further include a first transistor TR1 connected between the bit line BL and the sensing node SO.

The sense latch 1211 may store data stored in a memory cell or a sensing result of a threshold voltage of a memory cell, during a read or program verify operation. During a program execution operation, the sense latch 1211 may be used to apply a program bit line voltage (for example, Vprogram_BL of FIG. 13) or a program inhibit voltage (for example, Vinhibit of FIG. 13) to the bit line BL. The force latch 1212 may be used to improve a threshold voltage distribution during a program operation. A value stored in the force latch 1212 may be changed according to the threshold voltage of the memory cell during the program operation, and a voltage that is applied to the bit line BL may vary according to the value stored in the force latch 1212 during program execution. This will be described in greater detail with reference to FIG. 13.

The upper bit latch 1213, the lower bit latch 1214, and the cache latch 1215 may be used to store externally-input data during the program operation and may be referred to as a data latch. When 3-bit data is programmed to a single memory cell, the 3-bit data may be stored in each of the upper bit latch 1213, the lower bit latch 1214, and the cache latch 1215. Until a program operation of the memory cell is completed, the upper bit latch 1213, the lower bit latch 1214, and the cache latch 1215 may maintain stored data. The cache latch 1215 may receive, from the sense latch 1211, data read from the memory cell during a read operation and may output the received data to the outside via a data output line DOUT.

The first transistor TR1 may be driven by a bit line shut-off signal BLSHF that controls connection between the bit line BL and the sensing node SO, and accordingly, may be referred to as "a bit line shut-off transistor". For example, when data is read from the memory cell, the first transistor TR1 is turned on to electrically connect the bit line BL to the sense latch 1211. When the data stored in the sense latch 1211 is transmitted to the cache latch 1215 or the data stored in the cache latch 1215 is transmitted to the force latch 1212, the first transistor TR1 may be turned off.

Referring to FIG. 11B, a page buffer 121*a* may further include a suspend-resume latch (SR-latch) 1217, compared with the page buffer 121 of FIG. 11A. When suspending is entered during a program operation, the data stored in the cache latch 1215 may be transmitted to the SR-latch 1217 and then the cache latch 1215 may be made available. Thereafter, a requested read operation may be performed, the sense latch 1211 may store read-out data, and the read-out data stored in the sense latch 1211 may be transmitted to the cache latch 1215 and output to the outside via the data output line DOUT. Thereafter, the data stored in the SR-latch 1217 may be re-transmitted to the cache latch 1215, and the suspended program operation may be resumed.

Figure 12:
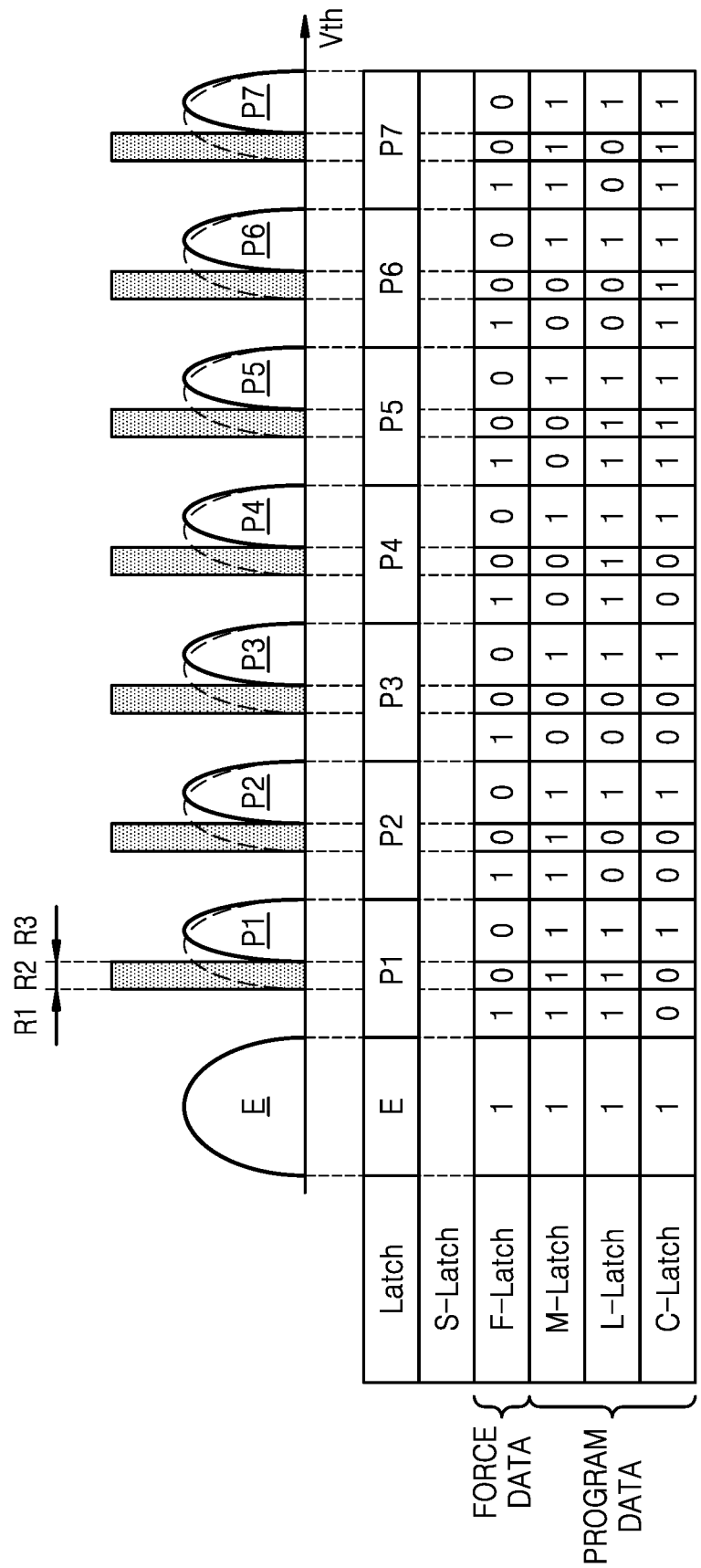
FIG. 12 illustrates latch values according to threshold values of a memory cell during a program operation, according to some embodiments of the inventive concepts.

FIG. 12 illustrates latch values according to threshold voltages of memory cells during a program operation, according to some embodiments of the inventive concepts.

Referring to FIGS. 11A and 12, 3-bit program data received from the memory controller 200 may be stored in the upper bit latch 1213, the lower bit latch 1214, and the cache latch 1215 such that the three bits of the 3-bit program data are stored in the upper bit latch 1213, the lower bit latch 1214, and the cache latch 1215, respectively. For example, when the 3-bit program data is '110', a target program state may be the first program state P1, '1' may be stored in the upper bit latch 1213, '1' may be stored in the lower bit latch 1214, and '0' may be stored in the cache latch 1215.

The values stored in the upper bit latch 1213, the lower bit latch 1214, and the cache latch 1215 may maintain externally-input program data values before the threshold voltages of the memory cells enter a target region, and then may be all changed to '1' when the threshold voltages of the memory cells have entered the target region. For example, when the 3-bit program data is '110' and the threshold voltages of the memory cells have entered a first region R1 or a second region R2, the values stored in the upper bit latch 1213, the lower bit latch 1214, and the cache latch 1215 maintain '110', which is the original program data value. When the threshold voltages of the memory cells have entered a third region R3, the values stored in the upper bit latch 1213, the lower bit latch 1214, and the cache latch 1215 may be all changed to '1'.

The force latch 1212 stores force data. After the force data is initially set to be '1', when the threshold voltages of the memory cells have not yet reached the target region but have entered a forcing region or forcing range, the force data may be reversed to '0'. For example, when the program data is '110' and the threshold voltages of the memory cells have entered the second region R2, the value stored in the force latch 1212 is reversed from '1' to '0'. The force data may be used to control a bit line voltage during a program execution operation and form a narrow program threshold voltage distribution. Although the first through third regions R1 through R3 for the first program state P1 are illustrated in FIG. 12, first through third regions may likewise be distinguished based on the target region for the other program states.

Figure 13:
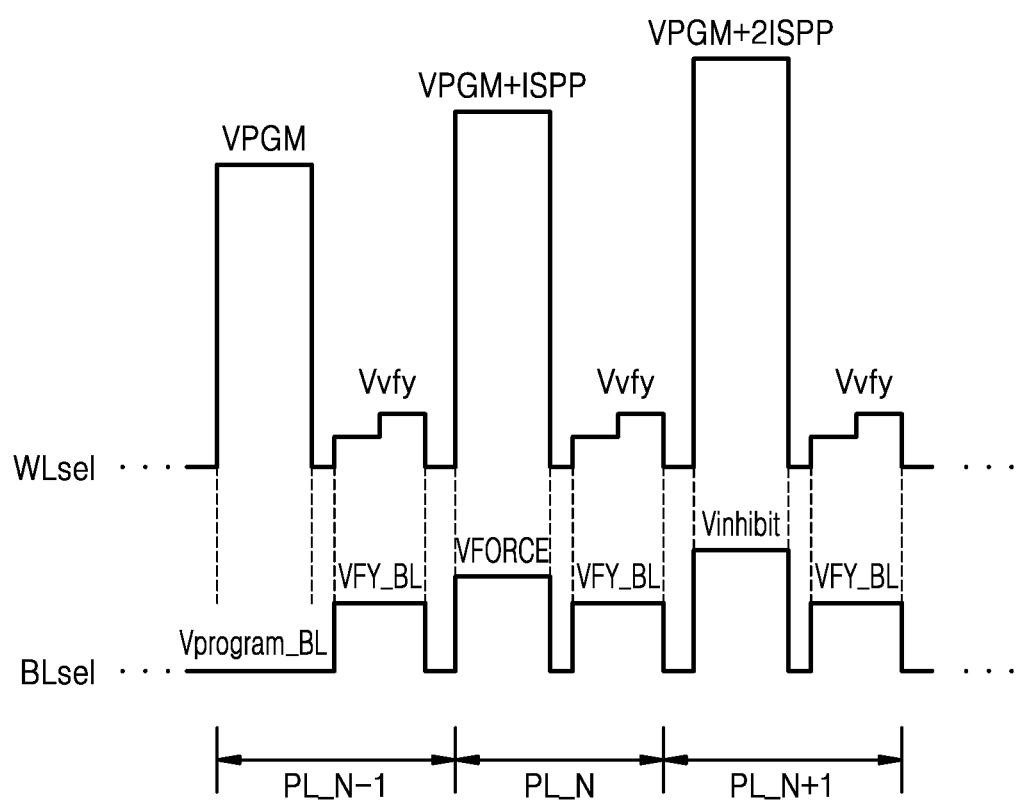
FIG. 13 illustrates voltages of a selected word line and a selected bit line during a program operation, according to some embodiments of the inventive concepts.

FIG. 13 illustrates voltages of a selected word line and a selected bit line during a program operation, according to some embodiments of the inventive concepts.

Referring to FIGS. 12 and 13, during a program execution operation of the (N−1)th program loop PL_N−1, a program voltage VPGM may be applied to a selected word line WLsel. When the threshold voltage of a selected memory cell is in the first region R1, the upper bit latch 1213, the lower bit latch 1214, and the cache latch 1215 may maintain initial program data, and the value of the force latch 1212 may be '1'. As a result, a program bit line voltage Vprogram_BL may be applied to a selected bit line BLsel. The program bit line voltage Vprogram_BL is typically a ground voltage. Thereafter, a program verify operation may be performed, the program verify operation may include at least one of the first through seventh program verify operations VFY1 through VFY7, and a program verify voltage Vvfy may be applied to the selected word line WLsel.

During a program execution operation of the N-th program loop PL_N, a voltage VPGM+ISPP that is greater than the program voltage VPGM of the (N−1)th program loop PL_N−1 by the ISSP level may be applied to the selected word line WLsel. When the threshold voltage of the selected memory cell is in the second region R2, the value of the force latch 1212 may be a value, namely, '0', reversed from the initial value, and, consequently, a program force voltage VFORCE may be applied to the selected bit line BLsel. The program force voltage VFORCE may be higher than the ground voltage and lower than the program inhibit voltage Vinhibit. By using this program force voltage VFORCE, the program threshold voltage distribution may be controlled to have a small width.

During a program execution operation of the (N+1)th program loop PL_N+1, a voltage VPGM+2ISPP that is 2ISSP greater than the program voltage VPGM of the (N−1)th program loop PL_N−1 may be applied to the selected word line WLsel. When the threshold voltage of the selected memory cell is in the third region R3, data latches of the page buffer 121 corresponding to the selected memory cell may all have a value of '1', and, consequently, the program inhibit voltage Vinhibit may be applied to the selected bit line BLsel. The program inhibit voltage Vinhibit may be typically an internal power supply voltage VCC.

Figure 14:
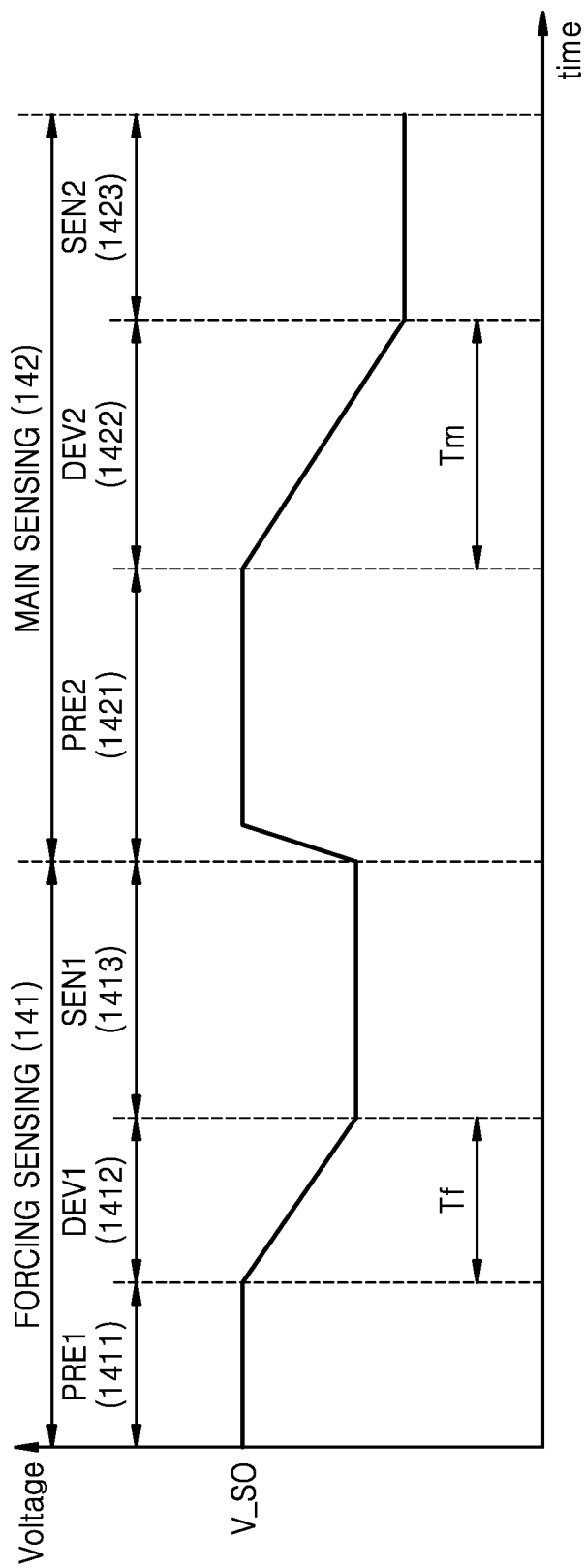
FIG. 14 is a graph showing a variation in a sensing node voltage according to a normal program verify operation, according to some embodiments of the inventive concepts.

FIG. 14 is a graph showing a variation in a sensing node voltage according to a normal program verify operation, according to some embodiments of the inventive concepts.

Referring to FIG. 14, the horizontal axis represents time and the vertical axis represents a voltage V_SO of the sensing node SO. A normal program verify operation according to the present embodiment may correspond to an implementation of the normal program verify operation 101 of FIG. 10. According to some embodiments, the normal program verify operation may be a 2-step verify operation including a forcing sensing section 141 and a main sensing section 142. In the forcing sensing section 141, forcing sensing or pre-verification may be performed. In the main sensing section 142, main sensing or main verification may be performed. However, the inventive concepts are not limited thereto, and the normal program verify operation may be a 1-step verify operation including only the main sensing section 142.

The forcing sensing section 141 may include a first precharge section 1411, a first develop section 1412, and a first sensing section 1413. In the first develop section 1412, the voltage level of the sensing node SO changes according to the voltage level of a bit line. In this case, a length of the first develop section 1412 may correspond to a normal forcing develop time Tf. The main sensing section 142 may include a second precharge section 1421, a second develop section 1422, and a second sensing section 1423. In this case, a length of the second develop section 1422 may correspond to a normal main develop time Tm. The normal main develop time Tm may be longer than the normal forcing develop time Tf.

Figure 15A:
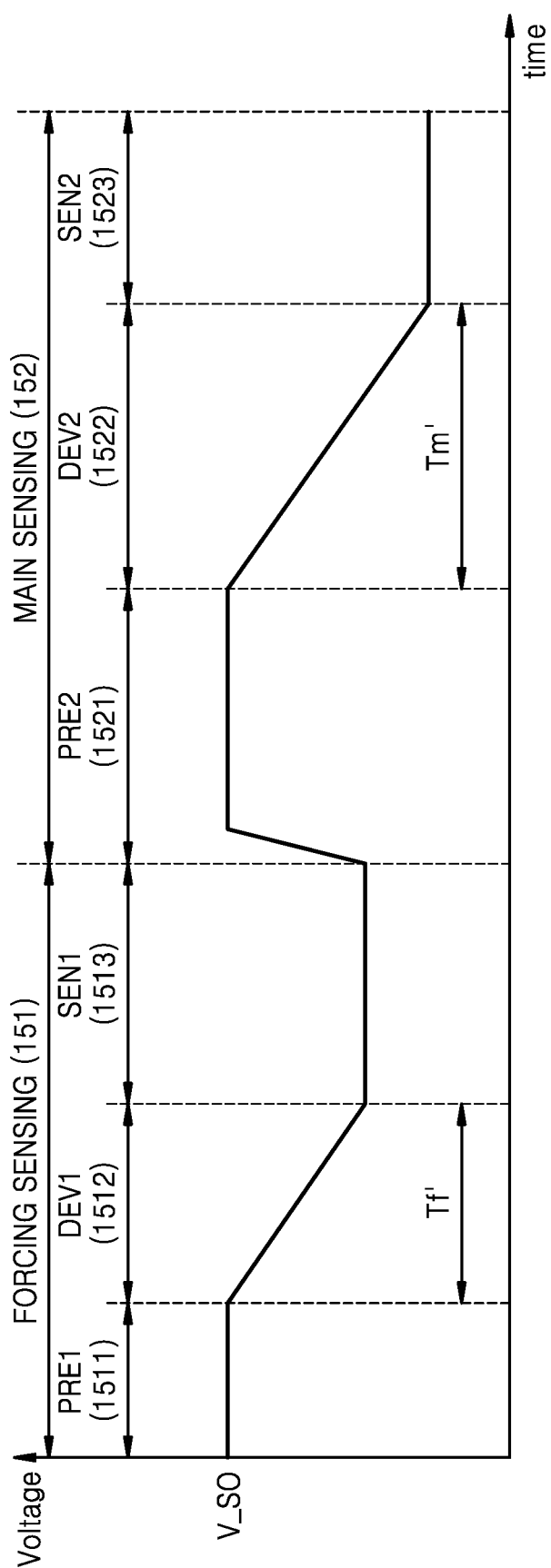
FIGS. 15A and 15B are graphs showing variations in sensing node voltages according to initial program verify operations, according to embodiments of the inventive concepts.
Figure 15B:
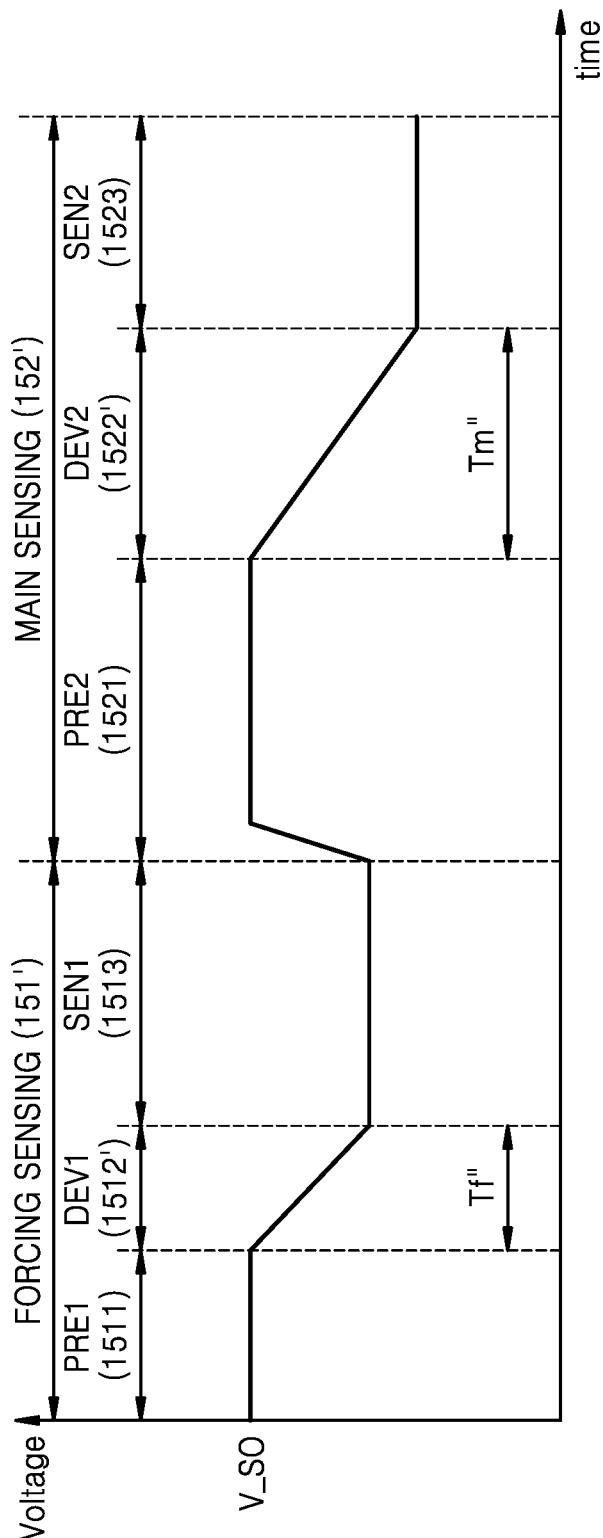

FIGS. 15A and 15B are graphs showing variations in sensing node voltages according to initial program verify operations, according to embodiments of the inventive concepts.

Referring to FIGS. 14 and 15A, an initial program verify operation according to the present embodiment may correspond to an implementation of the initial program verify operation 102 of FIG. 10. A forcing sensing section 151 may include a first precharge section 1511, a first develop section 1512, and a first sensing section 1513. A length of the first develop section 1512 may correspond to a first forcing develop time Tf', and the first forcing develop time Tf' may be longer than the normal forcing develop time Tf. A main sensing section 152 may include a second precharge section 1521, a second develop section 1522, and a second sensing section 1523. A length of the second develop section 1522 may correspond to a first main develop time Tm', and the first main develop time Tm' may be longer than the normal main develop time Tm.

Referring to FIGS. 14 and 15B, an initial program verify operation according to the present embodiment may correspond to an implementation of the initial program verify operation 103 of FIG. 10. A forcing sensing section 151' may include a first precharge section 1511, a first develop section 1512', and a first sensing section 1513. A length of the first develop section 1512' may correspond to a second forcing develop time Tf", and the second forcing develop time Tf" may be shorter than the normal forcing develop time Tf. A main sensing section 152' may include a second precharge section 1521, a second develop section 1522', and a second sensing section 1523. A length of the second develop section 1522' may correspond to a second main develop time Tm", and the second main develop time Tm" may be shorter than the normal main develop time Tm.

Figure 16:
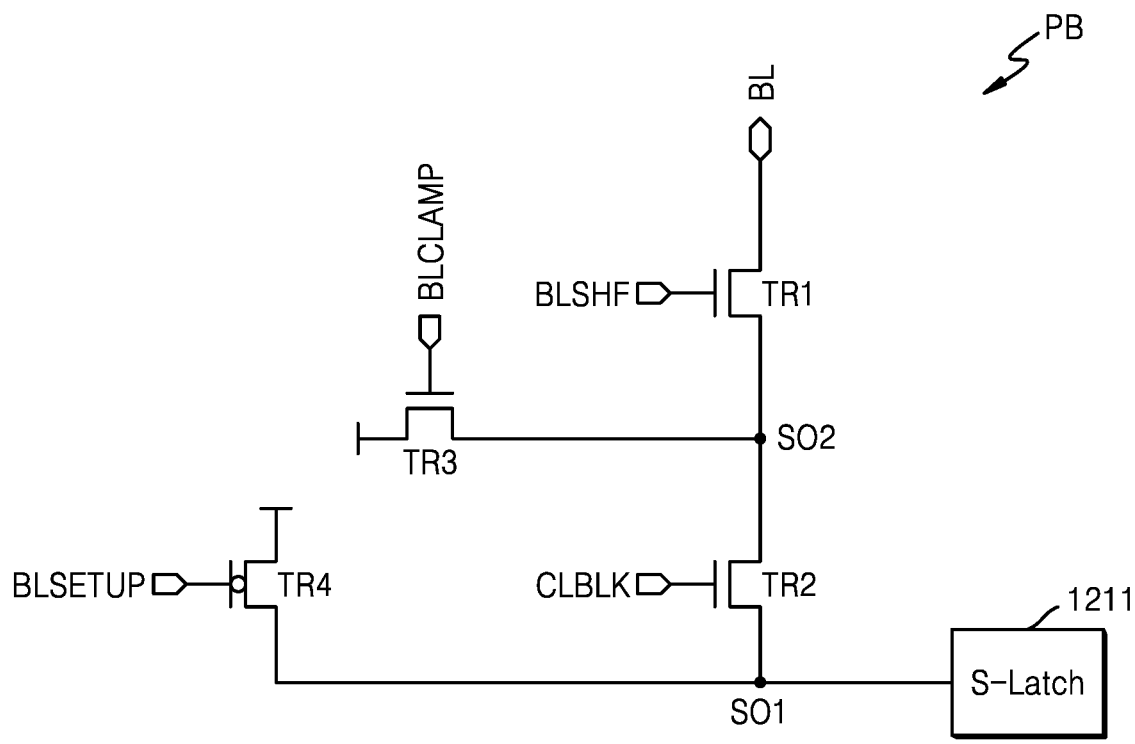
FIG. 16 is a circuit diagram of a portion of a page buffer according to some embodiments of the inventive concepts.

FIG. 16 is a circuit diagram of a portion of a page buffer PB according to some embodiments of the inventive concepts.

Referring to FIG. 16, the page buffer PB may include first through fourth transistors TR1 through TR4 and a sense latch 1211. The page buffer PB may be one of the plurality of page buffers PB1 through PBn of FIG. 1 and may correspond to an implementation of the page buffer 121 of FIG. 11A or the page buffer 121a of FIG. 11B. For example, a first sensing node SO1 may correspond to the sensing node SO of the page buffer 121 of FIG. 11A. Although not shown in FIG. 16, the first sensing node SO1 may also be connected to the force latch 1212, the upper bit latch 1213, the lower bit latch 1214, and the cache latch 1215.

The first transistor TR1 may be connected between a bit line BL and a sensing node SO2 and may be driven by a bit line shut-off signal BLSHF. The second transistor TR2 may be connected between the first and second sensing nodes SO1 and SO2 and may be driven by a bit line connection control signal CLBLK. The third transistor TR3 may be connected to the second sensing node SO2 and may be driven by a bit line clamping signal BLCLAMP. When the bit line clamping signal BLCLAMP is activated, the third transistor TR3 may clamp a voltage of the second sensing node SO2. For example, the first through third transistors TR1 through TR3 may be implemented by using NMOS transistors.

The fourth transistor TR4 may be connected to the first sensing node SO1 and may be driven by a bit line setup signal BLSETUP. When the bit line setup signal BLSETUP is activated, the fourth transistor TR4 may precharge a voltage of the bit line BL or the first sensing node SO1 to a precharge level. For example, the fourth transistor TR4 may be implemented by using a PMOS transistor.

Figure 17:
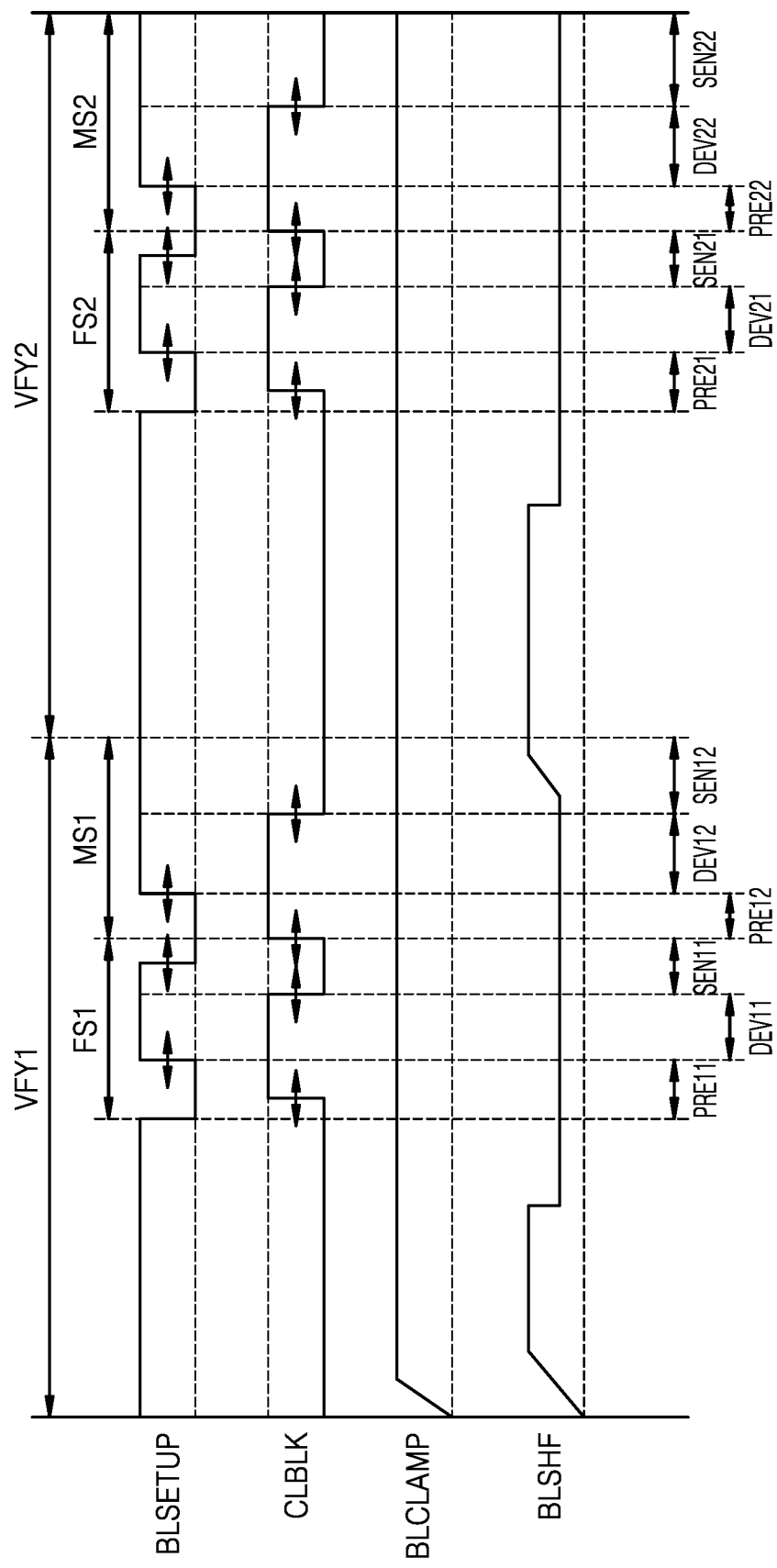
FIG. 17 illustrates control signals that are applied to first through fourth transistors included in the page buffer of FIG. 16 during a program verify operation according to some embodiments of the inventive concepts.

FIG. 17 illustrates control signals that are applied to the first through fourth transistors TR1 through TR4 included in the page buffer PB of FIG. 16 during a program verify operation according to some embodiments of the inventive concepts.

Referring to FIGS. 1, 16, and 17, the program verify operation may include, for example, a first program verify operation VFY1 and a second program verify operation VFY2. The first program verify operation VFY1 represents an operation of verifying whether programming of a memory cell to the first program state P1 has been completed, and the second program verify operation VFY2 represents an operation of verifying whether programming of the memory cell to the second program state P2 has been completed. However, the program verify operation may include more program verify operations than the two first and second program verify operations VFY1 and VFY2 in order to verify whether programming to more program states than the two first and second program states P1 and P2 has been completed.

The first program verify operation VFY1 may include a first forcing sensing section FS1 and a first main sensing section MS1. The first forcing sensing section FS1 may include a first precharge section PRE11, a first develop section DEV11, and a first sensing section SEN11. The first precharge section PRE11 may be defined as an activation section of the bit line setup signal BLSETUP, namely, a time section from a time point when the bit line setup signal BLSETUP transitions to logic low to a time point when the bit line setup signal BLSETUP transitions to logic high.

The first develop section DEV11 may be defined as a time section from a time point when the bit line setup signal BLSETUP is deactivated to a time point when the bit line connection control signal CLBLK is deactivated. In other words, the first develop section DEV11 may be defined as a time section from a time point when the bit line setup signal BLSETUP transitions to logic high to a time point when the bit line connection control signal CLBLK transitions to logic low.

According to some embodiments, a length of the first develop section DEV11 may be changed according to whether the program verify operation is a normal program verify operation or an initial program verify operation. Accordingly, the control logic unit 130 may control the time point when the bit line setup signal BLSETUP is deactivated or the time point when the bit line connection control signal CLBLK is deactivated, according to the type of a program verify operation. In detail, during an initial program verify operation, the control logic unit 130 may control the time point when the bit line setup signal BLSETUP is deactivated or the time point when the bit line connection control signal CLBLK is deactivated, differently from a normal program verify operation.

The first sensing section SEN11 may be defined as a deactivation section of the bit line connection control signal CLBLK, namely, a time section from a time point when the bit line connection control signal CLBLK transitions to logic low to a time point when the bit line connection control signal CLBLK transitions to logic high. When a length of the first develop section DEV11 is changed, a time point when the first sensing section SEN11 begins may be changed. Accordingly, the control logic unit 130 may control the time point when the bit line connection control signal CLBLK is deactivated, according to the type of a program verify operation.

The first main sensing section MS1 may include a second precharge section PRE12, a second develop section DEV12, and a second sensing section SEN12. The second precharge section PRE12 may be defined as an activation section of the bit line setup signal BLSETUP. The second develop section DEV12 may be defined as a time section from a time point when the bit line setup signal BLSETUP is deactivated to a time point when the bit line connection control signal CLBLK is deactivated. The second sensing section SEN12 may be defined as a deactivation section of the bit line connection control signal CLBLK.

According to some embodiments, a length of the second develop section DEV12 may be changed according to whether the program verify operation is a normal program verify operation or an initial program verify operation. Accordingly, the control logic unit 130 may control the time point when the bit line setup signal BLSETUP is deactivated or the time point when the bit line connection control signal CLBLK is deactivated, according to the type of a program verify operation. In detail, during the initial program verify operation, the control logic unit 130 may control the time point when the bit line setup signal BLSETUP is deactivated or the time point when the bit line connection control signal CLBLK is deactivated, differently from the normal program verify operation. The control logic unit 130 may control the time point when the bit line connection control signal CLBLK is deactivated, according to the type of a program verify operation.

The second program verify operation VFY2 may include a second forcing sensing section FS2 and a second main sensing section MS2. The second forcing sensing section FS2 may include a first precharge section PRE21, a first develop section DEV21, and a first sensing section SEN21. The first precharge section PRE21, the first develop section DEV21, and the first sensing section SEN21 may correspond to the first precharge section PRE11, the first develop section DEV11, and the first sensing section SEN11, respectively, and thus repeated descriptions thereof will be omitted. The second main sensing section MS2 may include a second precharge section PRE22, a second develop section DEV22, and a second sensing section SEN22. The second precharge section PRE22, the second develop section DEV22, and the second sensing section SEN22 may correspond to the second precharge section PRE12, the second develop section DEV12, and the second sensing section SEN12, respectively, and thus repeated descriptions thereof will be omitted.

Figure 18A:
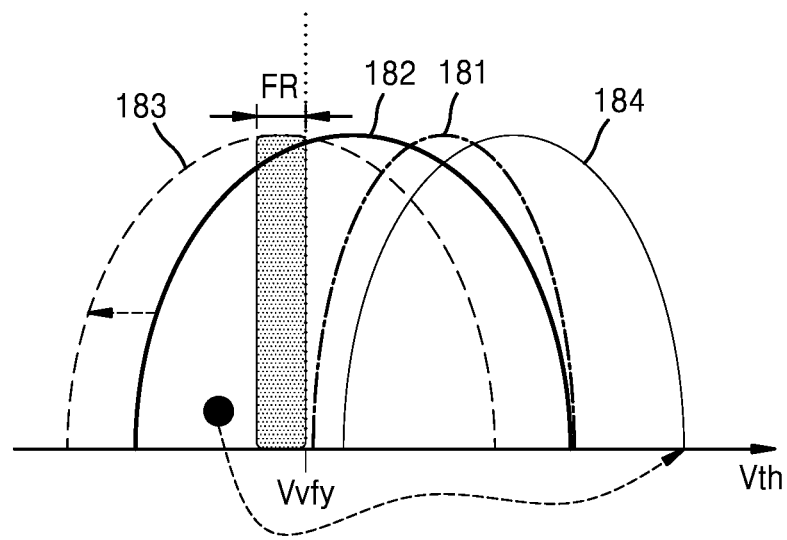
FIG. 18A illustrates a threshold voltage distribution due to a suspend-resume operation according to a comparative example of the inventive concepts.
Figure 18B:
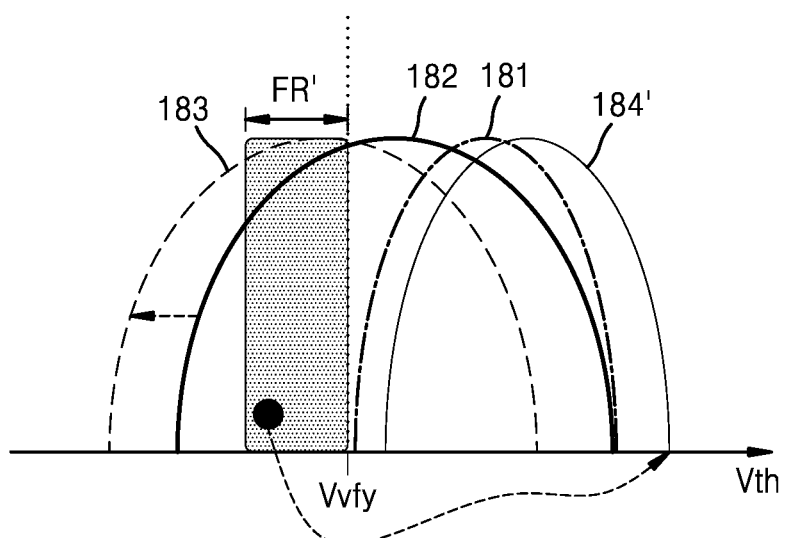
FIG. 18B illustrates a threshold voltage distribution due to a suspend-resume operation according to some embodiments of the inventive concepts.

FIG. 18A illustrates a threshold voltage distribution due to a suspend-resume operation according to a comparative example of the inventive concepts, and FIG. 18B illustrates a threshold voltage distribution due to a suspend-resume operation according to some embodiments of the inventive concepts.

Referring to FIG. 18A, a first distribution 181 represents a target distribution, a second distribution 182 represents an initial distribution at the moment when suspending has been entered, a third distribution 183 represents a changed distribution due to charge loss after the lapse of the suspend-resume time tRES, and a fourth distribution 184 represents a distribution due to a re-program operation after program resuming. A first forcing region or first forcing range FR may correspond to a certain region that is lower than a program verify voltage Vvfy. In this case, the first forcing region FR may be a forcing region that is used during a normal program verify operation and may correspond to, for example, the second region R2 of FIG. 12.

When the threshold voltage of a first memory cell is lower than the first forcing region FR and a normal program verify operation is performed after the resume command RES_CMD is received, the first memory cell may be determined to be program-failed. At this time, when the first memory cell is re-programmed to a program voltage obtained by increasing a program voltage by ISPP (for example, the voltage VPGM+ISPP of FIG. 13), the threshold voltage of the first memory cell may be greater than the target distribution 181. Accordingly, an error bit may be generated, and a read error may occur.

Referring to FIG. 18B, according to the present embodiment, during an initial program verify operation after the suspend command SUS_CMD or the resume command RES_CMD is received, the first forcing region FR may be changed to a second forcing region FR' by differentiating a develop time from a normal develop time. Accordingly, the first memory cell not included in the first forcing region FR may be included in the second forcing region FR', and a value of a force latch included in a page buffer connected to the first memory cell may be changed from '1' to '0'. Thus, the force voltage VFORCE may be applied to a bit line connected to the first memory cell in a program loop after the program operation is resumed, and the threshold voltage of the first memory cell may be increased less than in FIG. 18A. Consequently, by preventing an over-program operation of the first memory cell, a difference between an upper voltage level of the first distribution 181 and that of a fourth distribution 184' may be reduced.

Figure 19:
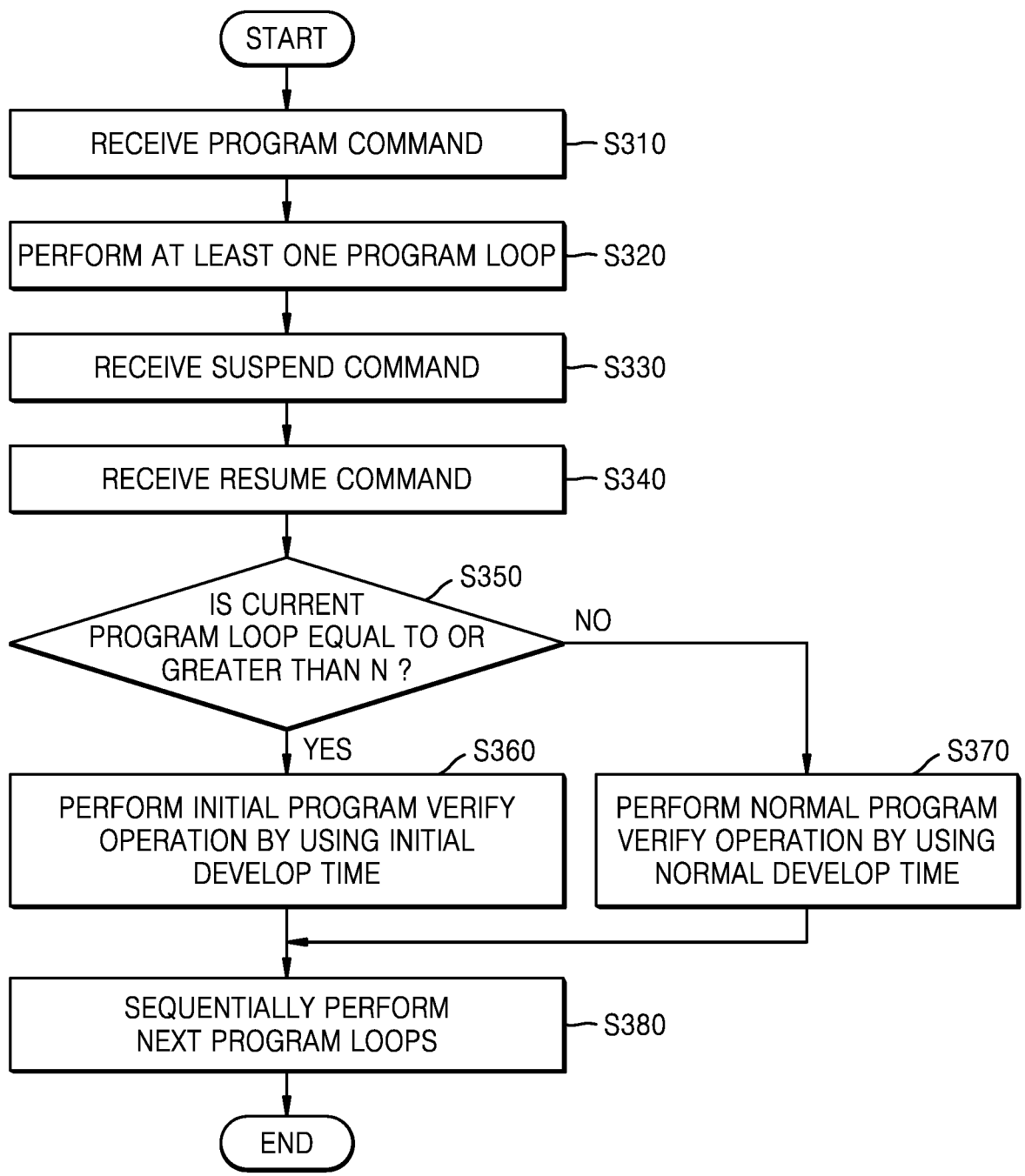
FIGS. 19 and 20 are flowcharts of methods of programming an NVM, according to embodiments of the inventive concepts.

FIG. 19 is a flowchart of a method of programming an NVM, according to some embodiments of the inventive concepts.

Referring to FIGS. 1 and 19, in operation S310, the NVM 100 receives the program command PGM_CMD. In operation S320, the NVM 100 performs at least one program loop in response to the program command PGM_CMD. In operation S330, the NVM 100 receives the suspend command SUS_CMD. In operation S340, the NVM 100 receives the resume command RES_CMD.

In operation S350, the NVM 100 determines whether a current program loop is greater than or equal to N. Here, N may be a natural number greater than or equal to 2. When it is determined in operation S350 that the current program loop is greater than or equal to N, the NVM 100 performs an initial program verify operation by using an initial develop time, in operation S360. On the other hand, when it is determined in operation S350 that the current program loop is less than N, the NVM 100 performs a normal program verify operation by using a normal develop time, in operation S370. However, the inventive concepts are not limited thereto. For example, according to some embodiments, operations S350 through S370 may be performed between operations S330 and S340. In operation S380, the NVM 100 sequentially performs next program loops in response to the resume command RES_CMD.

In programming methods of an NVM according to some embodiments, the NVM may determine whether programming to an M-th program state has been completed, instead of performing operation S350. In this case, when the programming to the M-th program state has been completed, the NVM may perform an initial program verify operation in operation S360, and, when the programming to the M-th program state has not been completed, the NVM may perform a normal program verify operation in operation S370.

Figure 20:
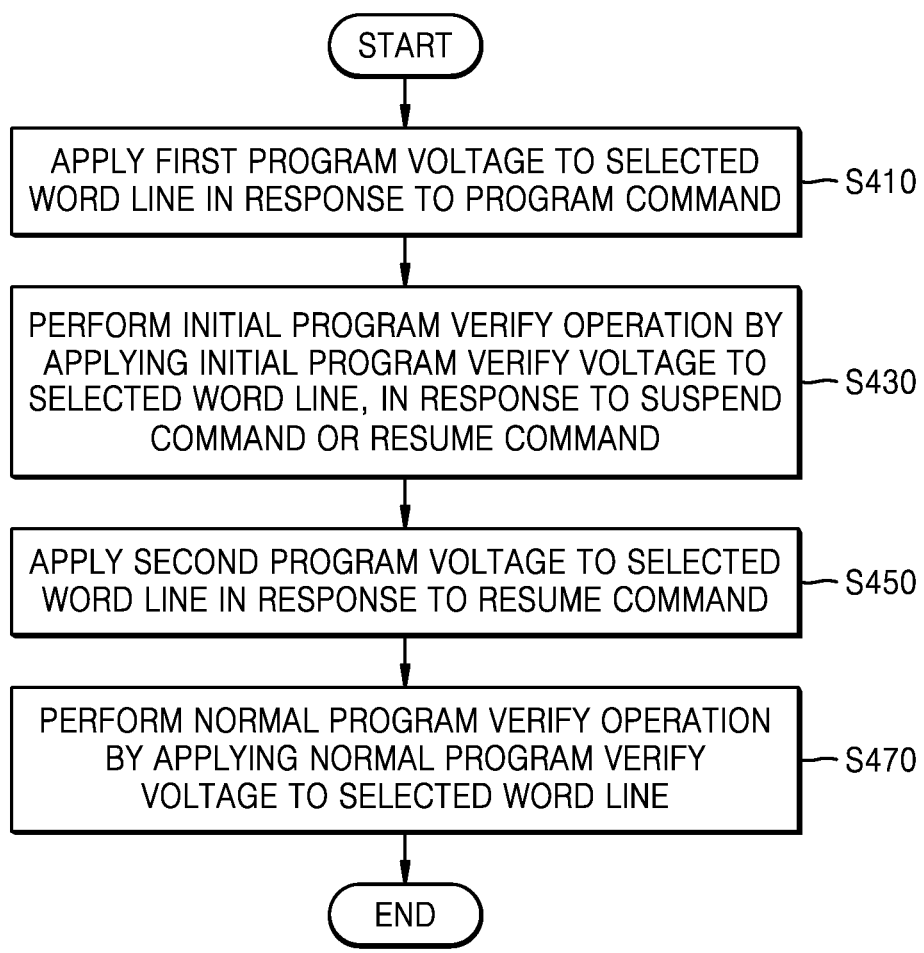

FIG. 20 is a flowchart of a method of programming an NVM, according to some embodiments of the inventive concepts.

Referring to FIG. 20, the programming method according to the present embodiment may correspond to a modification of the programming method of FIG. 9, and the descriptions given above with reference to FIG. 9 may be applied to the present embodiment. For example, the programming method according to the present embodiment may include the operations performed in a time sequential manner in the NVM 100 of FIG. 2.

In operation S410, the NVM 100 applies the first program voltage VPGM1 to the selected word line WLsel in response to the program command PGM_CMD. Operation S410 corresponds to a program execution operation. For example, operation S410 may correspond to the program execution operation in the N-th program loop PL_N of FIG. 6. In operation S430, the NVM 100 performs the initial program verify operation INT_VFY by applying an initial program verify voltage to the selected word line WLsel, in response to the suspend command SUS_CMD or the resume command RES_CMD. According to some embodiments, as illustrated in FIGS. 5 and 6, operation S430 may be performed after the resume command RES_CMD is received. According to some embodiments, as illustrated in FIG. 8, operation S430 may be performed after the suspend command SUS_CMD is received.

In operation S450, the NVM 100 applies the second program voltage VPGM2 to the selected word line WLsel in response to the resume command RES_CMD. Operation S450 corresponds to a program execution operation. For example, operation S450 may correspond to the program execution operation in the (N+1)th program loop PL_N+1 of FIG. 6. In operation S470, the NVM 100 performs the normal program verify operation N_VFY by applying a normal program verify voltage to the selected word line WLsel. The normal program verify voltage may be different from the initial program verify voltage.

Figure 21A:
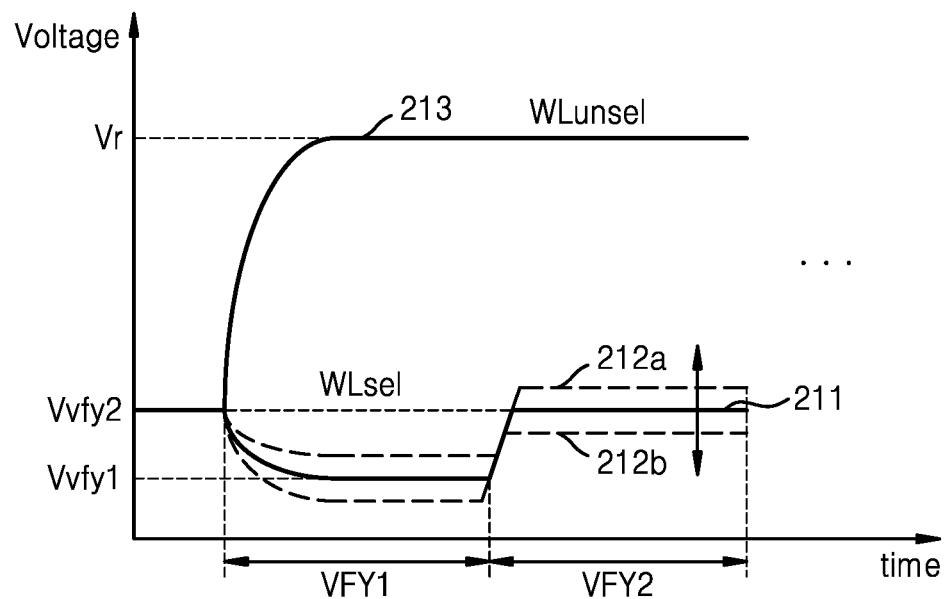
FIGS. 21A and 21B are graphs showing word line voltages over time during a program verify operation according to some embodiments of the inventive concepts.
Figure 21B:
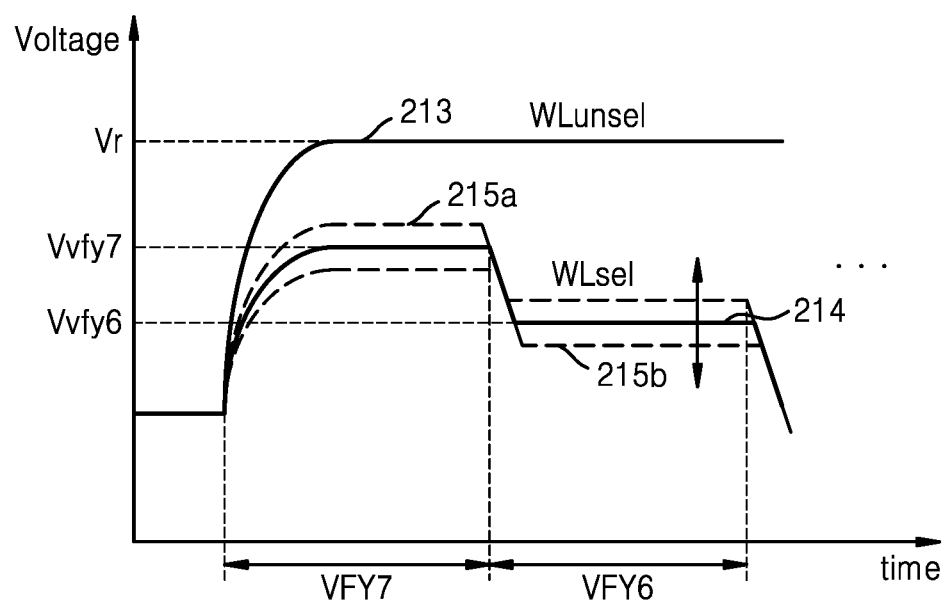

FIGS. 21A and 21B are graphs showing word line voltages over time during a program verify operation according to some embodiments of the inventive concepts.

Referring to FIG. 21A, according to a first program verification order, program verify operations may be performed from a lower program state to an upper program state. For example, the first program verify operation VFY1 with respect to the first program state P1 may be performed, and then the second program verify operation VFY2 with respect to the second program state P2 may be performed.

When the program verify operation is a normal program verify operation (for example, N_VFY of FIG. 6), the voltage of the selected word line WLsel may correspond to a normal program verify voltage 211. The normal program verify voltage 211 during the first program verify operation VFY1 may correspond to a first normal program verify voltage Vvfy1, and the normal program verify voltage 211 during the second program verify operation VFY2 may correspond to a second normal program verify voltage Vvfy2. A voltage of an unselected word line WLunsel may correspond to a read inhibit voltage Vr. For example, the read inhibit voltage Vr may be greater than a seventh normal program verify voltage Vvfy7.

When the program verify operation is an initial program verify operation (for example, INT_VFY of FIG. 6), the voltage of the selected word line WLsel may correspond to an initial program verify voltage 212a or an initial program verify voltage 212b. When the voltage of the selected word line WLsel is the initial program verify voltage 212a, the initial program verify voltage 212a during the first program verify operation VFY1 may be greater than the first normal program verify voltage Vvfy1, and the initial program verify voltage 212a during the second program verify operation VFY2 may be greater than the second normal program verify voltage Vvfy2. When the voltage of the selected word line WLsel is the initial program verify voltage 212b, the initial program verify voltage 212b during the first program verify operation VFY1 may be less than the first normal program verify voltage Vvfy1, and the initial program verify voltage 212b during the second program verify operation VFY2 may be less than the second normal program verify voltage Vvfy2.

Referring to FIG. 21B, according to a second program verification order, program verify operations may be performed from an upper program state to a lower program state. For example, the seventh program verify operation VFY7 with respect to the seventh program state P7 (e.g., having the highest target threshold voltage) may be performed, and then the sixth program verify operation VFY6 with respect to the sixth program state P6 may be performed.

When the program verify operation is a normal program verify operation (for example, N_VFY of FIG. 6), the voltage of the selected word line WLsel may correspond to a normal program verify voltage 214. The normal program verify voltage 214 during the seventh program verify operation VFY7 may correspond to a seventh normal program verify voltage Vvfy7, and the normal program verify voltage 214 during the sixth program verify operation VFY6 may correspond to a sixth normal program verify voltage Vvfy6. The voltage of the unselected word line WLunsel may correspond to the read inhibit voltage Vr. For example, the read inhibit voltage Vr may be greater than the seventh normal program verify voltage Vvfy7.

When the program verify operation is an initial program verify operation (for example, INT_VFY of FIG. 6), the voltage of the selected word line WLsel may correspond to an initial program verify voltage 215a or an initial program verify voltage 215b. When the voltage of the selected word line WLsel is the initial program verify voltage 215a, the initial program verify voltage 215a during the seventh program verify operation VFY7 may be greater than the seventh normal program verify voltage Vvfy7, and the initial program verify voltage 215a during the sixth program verify operation VFY6 may be greater than the sixth normal program verify voltage Vvfy6. When the voltage of the selected word line WLsel is the initial program verify voltage 215b, the initial program verify voltage 215b during the seventh program verify operation VFY7 may be less than the seventh normal program verify voltage Vvfy7, and the initial program verify voltage 215b during the sixth program verify operation VFY6 may be less than the sixth normal program verify voltage Vvfy6.

Figure 22:
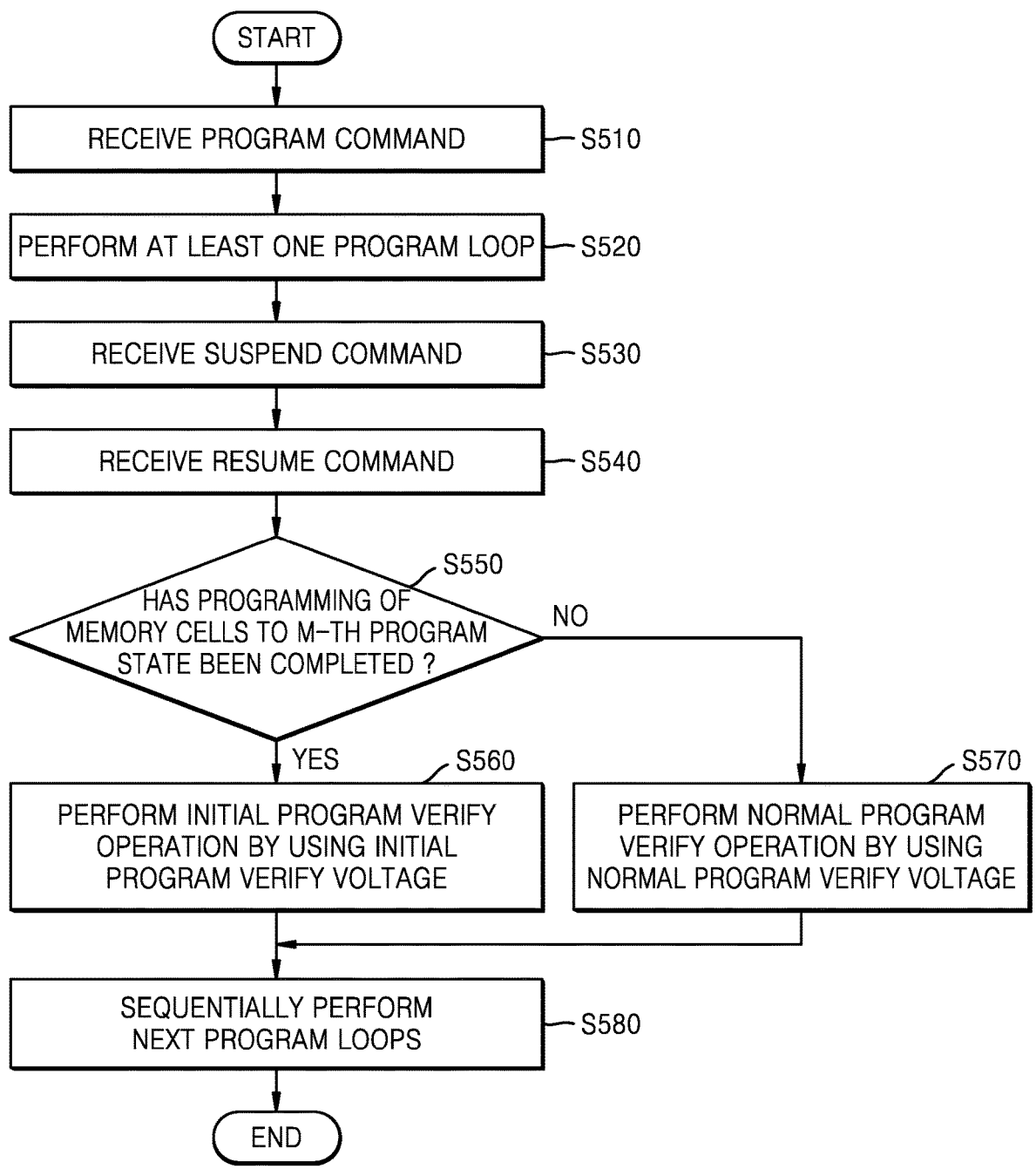
FIG. 22 is a flowchart of a method of programming an NVM, according to some embodiments of the inventive concepts.

FIG. 22 is a flowchart of a method of programming an NVM, according to some embodiments of the inventive concepts.

Referring to FIGS. 1 and 22, in operation S510, the NVM 100 receives the program command PGM_CMD. In operation S520, the NVM 100 performs at least one program loop in response to the program command PGM_CMD. In operation S530, the NVM 100 receives the suspend command SUS_CMD. In operation S540, the NVM 100 receives the resume command RES_CMD.

In operation S550, the NVM 100 may determine whether programming of memory cells to the M-th program state has been completed. When it is determined in operation S550 that programming of the memory cells to the M-th program state has been completed, the NVM 100 performs an initial program verify operation by using an initial program verify voltage, in operation S560. When it is determined in operation S550 that programming of the memory cells to the M-th program state has not been completed, the NVM 100 performs a normal program verify operation by using a normal program verify voltage, in operation S570. However, the inventive concepts are not limited thereto. For example, according to some embodiments, operations S550 through S570 may be performed between operations S530 and S540. In operation S580, the NVM 100 sequentially performs next program loops in response to the resume command RES_CMD.

In programming methods of an NVM according to some embodiments, the NVM 100 may determine whether a current program loop is greater than or equal to N, instead of performing operation S550. When it is determined that the current program loop is greater than or equal to N, the NVM 100 may perform an initial program verify operation by using an initial program verify voltage that is different from a normal program verify voltage in operation S560. On the other hand, when it is determined that the current program loop is less than N, the NVM 100 may perform a normal program verify operation by using a normal program verify voltage in operation S570.

Figure 23:
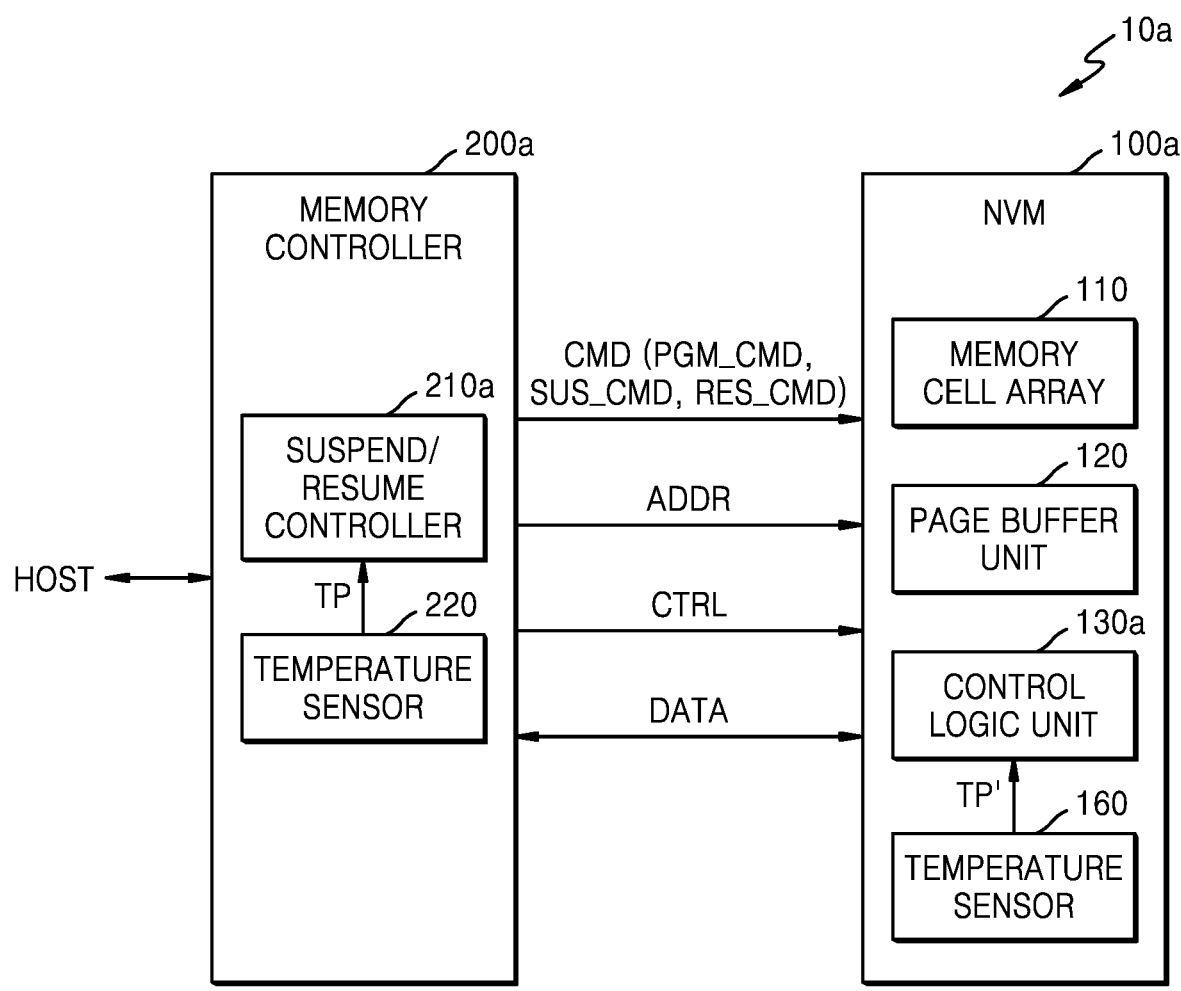
FIG. 23 is a block diagram of a memory system according to some embodiments of the inventive concepts.

FIG. 23 is a block diagram of a memory system 10a according to some embodiments of the inventive concepts. The memory system 10a may correspond to a modification of the memory system 10 of FIG. 1, and the descriptions given above with reference to FIGS. 1 through 22 may be applied to the present embodiment.

Referring to FIG. 23, the memory system 10a may include an NVM 100a and a memory controller 200a. The memory controller 200a may include a suspend/resume controller 210a and a temperature sensor 220. The NVM 100 may include a memory cell array 110, a page buffer unit 120, a control logic unit 130a, and a temperature sensor 160. However, the inventive concepts are not limited thereto, and the memory system 10a may include only one of the temperature sensor 220 and the temperature sensor 160.

The temperature sensor 220 may sense a temperature of the memory system 10a and may provide a sensed temperature TP to the suspend/resume controller 210a. The suspend/resume controller 210a may control a suspend/resume operation, based on the sensed temperature TP. In detail, the suspend/resume controller 210a may control an initial program verify condition of an initial program verify operation according to the sensed temperature TP, and may transmit the controlled initial program verify condition to the NVM 100a.

The temperature sensor 160 may sense a temperature of the NVM 100a and may provide a sensed temperature TV to the control logic unit 130a. The control logic unit 130a may control the initial program verify condition of the initial program verify operation, based on the sensed temperature TV. For example, when the sensed temperature TV is greater than or equal to a reference temperature, the control logic unit 130a may perform an initial program verify operation during a suspend-resume operation. For example, as the sensed temperature TV increases, the control logic unit 130a may increase or decrease an offset between the initial program verify condition and the normal program verify condition.

Figure 24:
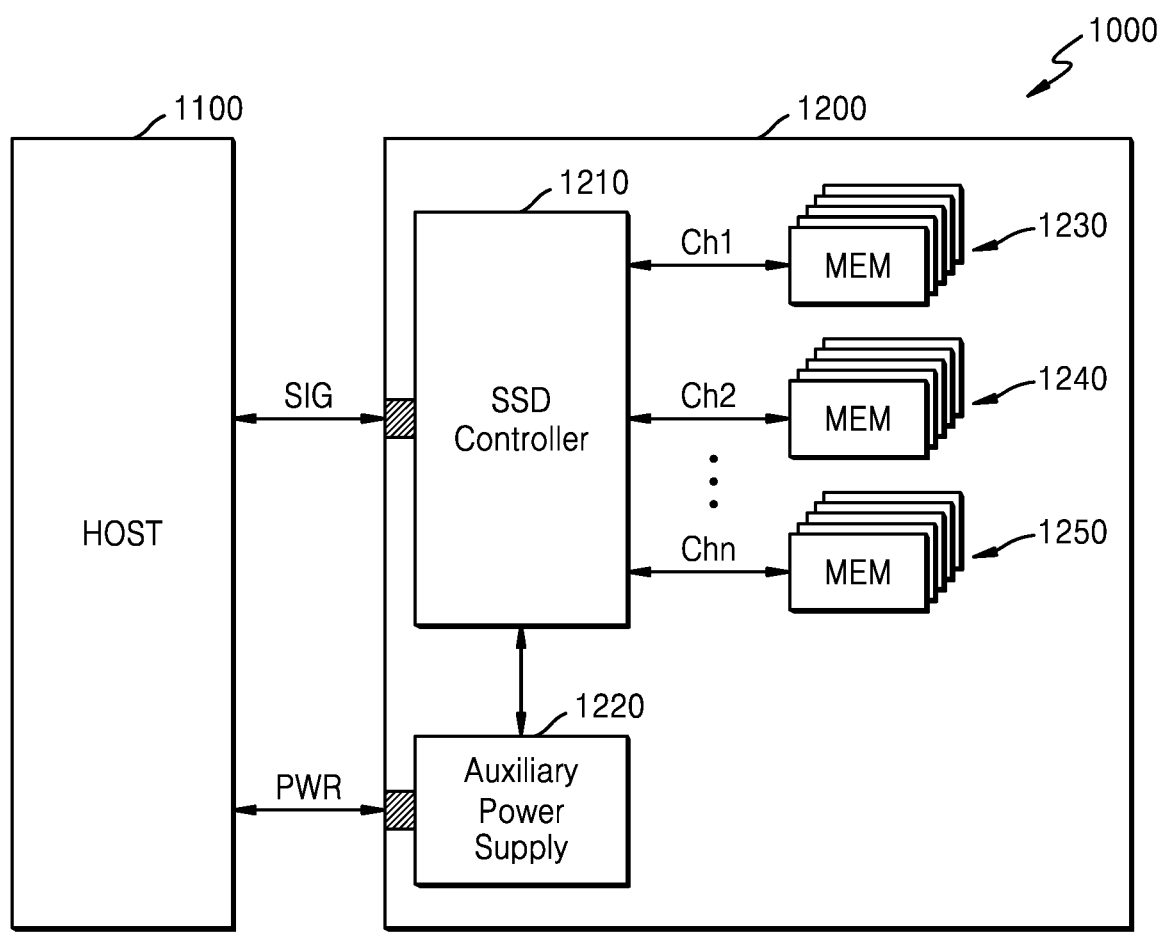
FIG. 24 is a block diagram of a solid-state drive (SSD) system to which memory devices according to embodiments of the inventive concepts have been applied.

FIG. 24 is a block diagram of a solid-state drive (SSD) system 1000 to which memory devices according to embodiments of the inventive concepts have been applied.

Referring to FIG. 24, the SSD system 1000 may include a host 1100 and an SSD 1200. The SSD 1200 communicates with the host 1100 based on signals transmitted/received via a signal connector and receives power via a power connector. The SSD 1200 may include an SSD controller 1210, an auxiliary power supply 1220, and memory devices 1230, 1240, and 1250. The memory devices 1230, 1240, and 1250 may be implemented using the embodiments described above with reference to FIGS. 1 through 23.

While the inventive concepts have been particularly shown and described with reference to embodiments thereof, it will be understood that various changes in form and details may be made therein without departing from the spirit and scope of the following claims.

What is claimed is:

1. A non-volatile memory device comprising:
   a memory cell array including memory cells respectively connected to bit lines; and
   a control logic unit configured to control a program operation with respect to the memory cells, wherein the control logic unit is further configured to:
   perform a normal program verify operation with respect to the memory cells by using a normal program verify condition, during the program operation; and
   based on a suspend command that is received during the program operation, perform an initial program verify operation with respect to the memory cells by using an initial program verify condition that is different from the normal program verify condition,
   wherein the normal program verify condition comprises a normal develop time, and the initial program verify condition comprises an initial develop time that is different from the normal develop time.

2. The non-volatile memory device of claim 1, wherein the initial program verify operation is performed in response to the suspend command or a resume command that is received after the suspend command.

3. The non-volatile memory device of claim 1, wherein the normal program verify operation is performed in a program loop before the suspend command is received or in a program loop after the initial program verify operation.

4. The non-volatile memory device of claim 1, wherein
   the normal develop time corresponds to a time section between a precharge section of the bit lines and a sensing section of sensing nodes respectively connected to the bit lines, during the normal program verify operation, and
   the initial develop time corresponds to a time section between the precharge section of the bit lines and the sensing section of the sensing nodes, during the initial program verify operation.

5. The non-volatile memory device of claim 1, further comprising:
   a page buffer unit including page buffers respectively connected to the bit lines,
   wherein a first page buffer from among the page buffers comprises:
   a first transistor connected to a first sensing node that is connected to a first bit line from among the bit lines, and driven by a bit line setup signal; and
   a second transistor connected between the first bit line and the first sensing node and driven by a bit line connection control signal, and
   each of the initial develop time and the normal develop time corresponds to a time section from a time point when the bit line setup signal is deactivated to a time point when the bit line connection control signal is deactivated.

6. The non-volatile memory device of claim 1, wherein the suspend command is received after an N-th program loop of the program operation, wherein N is a natural number that is greater than or equal to 2.

7. The non-volatile memory device of claim 6, wherein the suspend command is a first suspend command, and wherein,
   based on a second suspend command being received in one of first through (N−1)th program loops of the program operation, the control logic unit is further configured to perform the normal program verify operation with respect to the memory cells by using the normal program verify condition, in response to the second suspend command or a resume command received after the second suspend command.

8. The non-volatile memory device of claim 1, wherein the suspend command is received after programming of the memory cells to an M-th program state has been completed, wherein M is a natural number that is greater than or equal to 2.

9. The non-volatile memory device of claim 8, wherein the suspend command is a first suspend command, and wherein,
   based on a second suspend command being received before programming of the memory cells to the M-th program state is completed, the control logic unit is configured to perform the normal program verify operation with respect to the memory cells by using the normal program verify condition, in response to the second suspend command or a resume command received after the second suspend command.

10. The non-volatile memory device of claim 1, wherein the initial develop time comprises a forcing develop time, and wherein the initial program verify operation comprises:
    precharging a voltage of the bit lines to a precharge level, during a first precharge section;
    developing a voltage of sensing nodes, during the forcing develop time; and
    sensing the voltage of the sensing nodes, during a first sensing section, wherein
    the forcing develop time is different from a normal forcing develop time of the normal program verify operation.

11. The non-volatile memory device of claim 10, wherein the initial develop time further comprises a main develop time, and the initial program verify operation further comprises:
    precharging the voltage of the bit lines to the precharge level, during a second precharge section after the first sensing section;
    developing the voltage of the sensing nodes, during the main develop time; and sensing the voltage of the sensing nodes, during a second sensing section,
wherein the main develop time is different from a normal main develop time of the normal program verify operation.

12. A method of programming a non-volatile memory device, the method comprising:
applying a first program voltage to a selected word line to which memory cells are connected, in response to a program command;
performing an initial program verify operation by developing, during an initial develop time, voltage levels of sensing nodes respectively connected to bit lines respectively connected to the memory cells, in response to a suspend command or a resume command received after the suspend command;
applying a second program voltage to the selected word line in response to the resume command; and
performing a normal program verify operation by developing the voltage levels of the sensing nodes during a normal develop time that is different from the initial develop time.

13. The method of claim 12, wherein
the initial develop time corresponds to a time section between a precharge section of the bit lines and a sensing section of the sensing nodes during the initial program verify operation, and
the normal develop time corresponds to a time section between the precharge section of the bit lines and the sensing section of the sensing nodes, during the normal program verify operation.

14. The method of claim 12, wherein the performing of the normal program verify operation is performed after the applying of the first program voltage or the applying of the second program voltage.

15. The method of claim 12, wherein the initial develop time comprises a forcing develop time, and the performing of the initial program verify operation comprises:
precharging a voltage of the bit lines to a precharge level, during a first precharge section;
developing a voltage of the sensing nodes, during the forcing develop time; and
sensing the voltage of the sensing nodes, during a first sensing section,
wherein the forcing develop time is different from a normal forcing develop time of the normal program verify operation.

16. The method of claim 15, wherein the initial develop time further comprises a main develop time, and the performing of the initial program verify operation further comprises:
precharging the voltage of the bit lines to the precharge level, during a second precharge section after the first sensing section;
developing the voltage of the sensing nodes, during the main develop time; and
sensing the voltage of the sensing nodes, during a second sensing section,
wherein the main develop time is different from a normal main develop time of the normal program verify operation.

17. The method of claim 12, wherein the suspend command is received after an N-th program loop of a program operation or is received after programming of the memory cells to an M-th program state has been completed, wherein N and M are natural numbers that are greater than or equal to 2.

18. The method of claim 17, wherein the suspend command is a first suspend command, and wherein the method further comprises:
based on a second suspend command being received in one of first through (N−1)th program loops of the program operation, performing the normal program verify operation with respect to the memory cells by using the normal program verify condition, in response to the second suspend command or a resume command received after the second suspend command.

19. The method of claim 17, wherein the suspend command is a first suspend command, and wherein the method further comprises:
based on a second suspend command being received before programming of the memory cells to the M-th program state is completed, performing the normal program verify operation with respect to the memory cells by using the normal program verify condition, in response to the second suspend command or a resume command received after the second suspend command.

20. The method of claim 12, wherein the normal program verify operation is performed in a program loop before the suspend command is received or in a program loop after the initial program verify operation.

* * * * *